(12) United States Patent
Jimichi et al.

(10) Patent No.: US 11,428,748 B2
(45) Date of Patent: Aug. 30, 2022

(54) SYSTEM AND METHOD FOR TESTING POWER CONVERSION DEVICE

(71) Applicant: Mitsubishi Electric Corporation, Chiyoda-ku (JP)

(72) Inventors: Takushi Jimichi, Chiyoda-ku (JP); Takaharu Ishibashi, Chiyoda-ku (JP); Takuya Kajiyama, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 284 days.

(21) Appl. No.: 16/649,798

(22) PCT Filed: Jun. 11, 2018

(86) PCT No.: PCT/JP2018/022164
§ 371 (c)(1),
(2) Date: Mar. 23, 2020

(87) PCT Pub. No.: WO2019/092911
PCT Pub. Date: May 16, 2019

(65) Prior Publication Data
US 2020/0264239 A1    Aug. 20, 2020

(30) Foreign Application Priority Data
Nov. 10, 2017 (JP) .............................. JP2017-217083

(51) Int. Cl.
*G01R 31/40* (2020.01)
*H02M 3/335* (2006.01)
*H02M 7/219* (2006.01)

(52) U.S. Cl.
CPC ........ *G01R 31/40* (2013.01); *H02M 3/33576* (2013.01); *H02M 7/219* (2013.01)

(58) Field of Classification Search
CPC .. G01R 31/40; H02M 3/33576; H02M 7/219; H02M 1/0077; H02M 3/337; H02M 7/4835
(Continued)

(56) References Cited

U.S. PATENT DOCUMENTS

| 5,027,264 A | 6/1991 | DeDoncker et al. |
| 8,233,974 B2 * | 7/2012 | Ward ................... A61B 5/4878 |
| | | 600/547 |

(Continued)

FOREIGN PATENT DOCUMENTS

| CN | 105811460 A | 7/2016 |
| EP | 2 341 594 A1 | 7/2011 |

(Continued)

OTHER PUBLICATIONS

International Search Report dated Jul. 17, 2018 in PCT/JP2018/022164 filed on Jun. 11, 2018, 2 pages.

(Continued)

*Primary Examiner* — Giovanni Astacio-Oquendo
(74) *Attorney, Agent, or Firm* — Xsensus LLP

(57) ABSTRACT

A power conversion device which is a test target performs DC voltage conversion between a primary side DC terminal and a secondary side DC terminal. A first connection member electrically connects a testing power supply and the primary side DC terminal serving as an input side of the test target. A second connection member electrically connects the primary side DC terminal and the secondary side DC terminal of the power conversion device to transmit active power output from the secondary side DC terminal to the primary side DC terminal to be a part of active power input to the primary side DC terminal.

20 Claims, 12 Drawing Sheets

(58) Field of Classification Search
USPC .................................. 324/764.01, 537, 500
See application file for complete search history.

(56) References Cited

U.S. PATENT DOCUMENTS

| | | |
|---|---|---|
| 2013/0069666 A1 | 3/2013 | Wong |
| 2017/0358996 A1 | 12/2017 | Higaki et al. |
| 2022/0014018 A1* | 1/2022 | Higaki ................ H02J 3/38 |
| 2022/0021311 A1* | 1/2022 | Ishibashi ............ H02M 1/0058 |
| 2022/0029524 A1* | 1/2022 | Kajiyama ............ H02M 7/49 |
| 2022/0050144 A1* | 2/2022 | Tawada ................ G01R 31/54 |
| 2022/0134356 A1* | 5/2022 | Zhang ................ B03C 3/66 |
| | | 96/26 |

FOREIGN PATENT DOCUMENTS

| | | |
|---|---|---|
| EP | 3 416 278 A1 | 12/2018 |
| JP | 2000-241477 A | 9/2000 |
| JP | 4235936 B2 | 3/2009 |
| JP | 2017-143621 A | 8/2017 |
| WO | WO 2016/125374 A1 | 8/2016 |

OTHER PUBLICATIONS

De Doncker, R. W. A. A. et al., "A Three-Phase Soft-Switched High-Power-Density dc/dc Converter for High-Power Applications," IEEE Transactions on Industry Applications, vol. 27, No. 1, Jan./Feb. 1991, pp. 63-73.

Extended European search report dated Nov. 24, 2020, in corresponding European patent Application No. 18877150.5, 9 pages.

\* cited by examiner

100b

100c

SYSTEM AND METHOD FOR TESTING POWER CONVERSION DEVICE

TECHNICAL FIELD

The present disclosure relates to a system and method for testing a power conversion device, and more particularly to testing a power conversion device which performs direct current (DC) voltage conversion with an input and an output both being DC voltage.

BACKGROUND ART

As a power conversion device for DC voltage conversion (hereinafter also referred to as "DC/DC conversion"), Patent Literature 1 (U.S. Pat. No. 5,027,264) discloses that a configuration including two single- or three-phase full bridge circuits and a transformer is suitable for high power applications. Specifically, for the two full-bridge circuits, a DC terminal is connected to an input terminal or an output terminal of DC voltage, and an alternate current (AC) terminal is connected to a primary side winding or a secondary side winding of the transformer. This implements a power conversion device capable of DC/DC conversion with the primary side and the secondary side electrically insulated. Further, PTL 1 describes suppressing power loss by applying soft switching to semiconductor switching elements constituting each full bridge circuit.

CITATION LIST

Patent Literature

PTL 1: U.S. Pat. No. 5,027,264

Non Patent Literature

NPL 1: Rik W. A. A. De Doncker et. al., "A Three-Phase Soft-Switched High-Power-Density dc/dc Converter for High-Power Applications," IEEE TRANSACTIONS ON INDUSTRY APPLICATIONS, VOL. 27, NO. 1, January/February 1991.

SUMMARY OF INVENTION

Technical Problem

Testing a power conversion device, such as described in PTL 1, requires a testing power supply and peripheral devices such as a protective circuit breaker and a measuring instrument. In particular, testing a power conversion device for high power applications entails a testing power supply and peripheral devices having increased rated capacities, and a test system increased in size and cost is a matter of concern.

The present disclosure has been made to solve such a problem, and an object of the present disclosure is to provide a system and method for efficiently testing a power conversion device which performs DC/DC conversion.

Solution to Problem

According to an aspect of the present disclosure, a power conversion device test system includes at least one power conversion device which is a test target, a testing power supply for testing the test target, and first and second connection members. Each power conversion device performs DC voltage conversion between a primary side DC terminal and a secondary side DC terminal for inputting and outputting DC voltage. The first connection member connects the testing power supply and an input side of the test target. The second connection member electrically connects an output side of the test target and the testing power supply. Active power output from the output side of the test target is transmitted to the input side of the test target by the second connection member.

According to another aspect of the present disclosure, a method for testing a power conversion device is a method in which at least one power conversion device is a test target, each power conversion device performing DC voltage conversion between a primary side DC terminal and a secondary side DC terminal for inputting and outputting DC voltage. When testing the test target, from the testing power supply electrically connected to the input side of the test target by the first connection member, the test target, with its input and output sides electrically connected via the second connection member, is supplied via the first connection member with active power smaller than active power which passes through the test target.

Advantageous Effects of Invention

According to the present disclosure, by supplying from a testing power supply active power smaller than active power passing through a power conversion device, which is a test target, the power conversion device can be efficiently tested.

DESCRIPTION OF EMBODIMENTS

Hereinafter, embodiments of the present disclosure will be described in detail with reference to the drawings. Hereinafter, identical or equivalent components in the figures are identically denoted and will not be described redundantly in principle.

First Embodiment (Test Target)

Initially, an example configuration of a power conversion device which is a test target in the present embodiment will be described.

Figure 1:
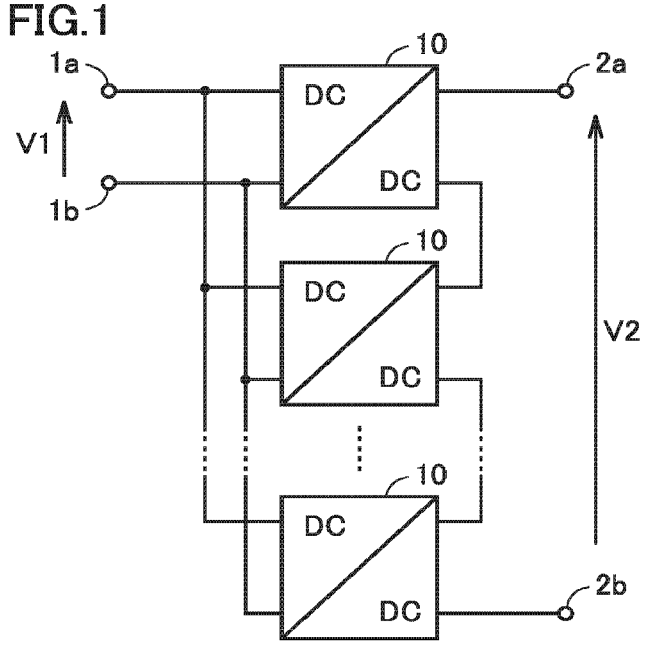
FIG. 1 is a block diagram for illustrating a first example of a power conversion device which is a test target.

FIG. 1 is a block diagram for illustrating a first example of a power conversion device which is a test target. Referring to FIG. 1, a power conversion device 100a according to the first example includes primary side DC terminals 1a and 1b, secondary side DC terminals 2a and 2b, and a plurality of converter cells 10. Converter cells 10 each perform DC/DC conversion.

Figure 2:
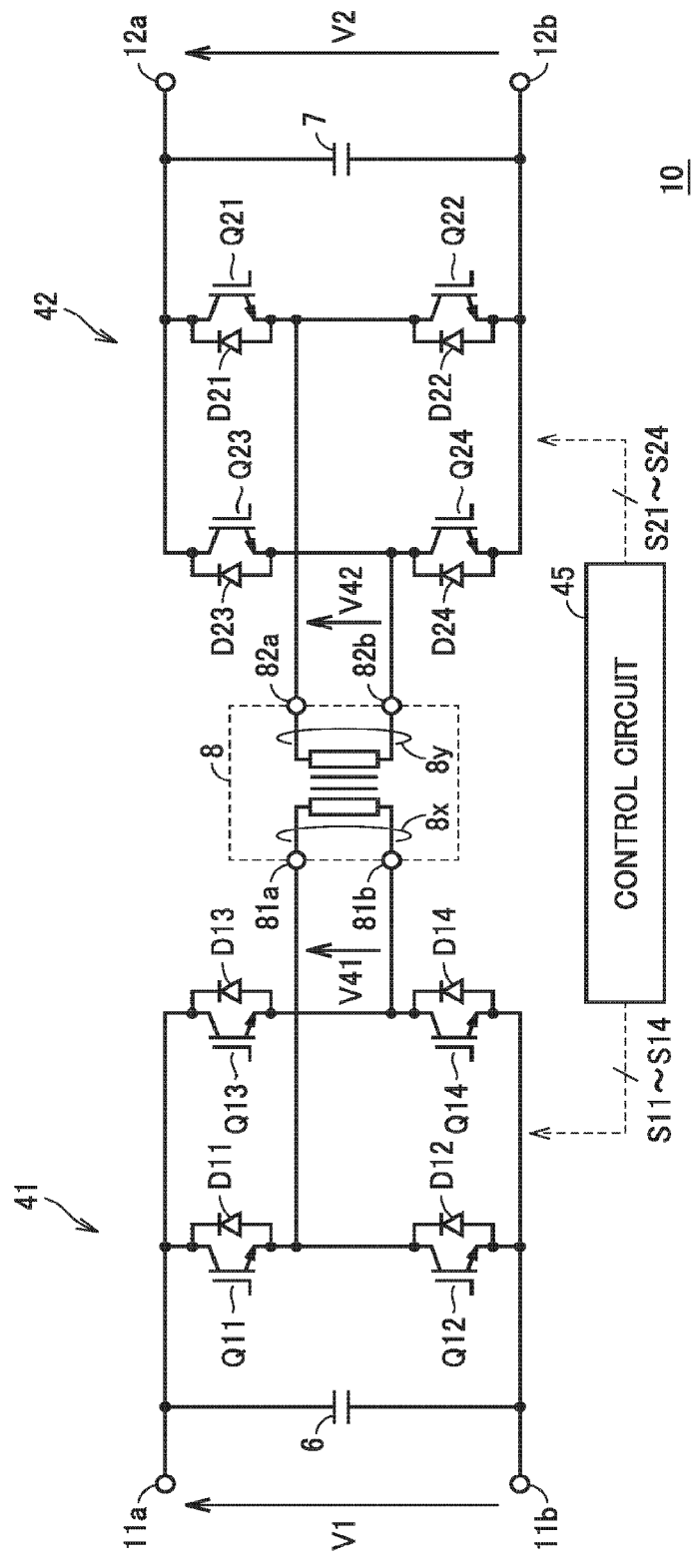
FIG. 2 is a circuit diagram for illustrating a first example configuration of a converter cell shown in FIG. 1.

FIG. 2 is a circuit diagram for illustrating a first example configuration of converter cell 10 shown in FIG. 1. Referring to FIG. 2, converter cell 10 according to the first example configuration includes capacitors 6 and 7, a single-phase transformer 8, a first switching circuit 41, a second switching circuit 42, and a control circuit 45. Control circuit 45 can be composed of dedicated hardware such as an analog circuit or an ASIC (Application Specific Integrated Circuit). Alternatively, control circuit 45 may have its functions partially or entirely implemented by software processing by a processor (not shown) executing a program installed in a memory (not shown).

Transformer 8 includes a single-phase primary side winding 8x connected to primary side AC nodes 81a and 81b, and a single-phase secondary side winding 8y connected to secondary side AC nodes 82a and 82b. Capacitor 6 is connected between primary side DC nodes 11a and 11b. Capacitor 7 is connected between secondary side DC nodes 12a and 12b.

First switching circuit 41 is connected between primary side DC nodes 11a and 11b and primary side AC nodes 81a and 81b. First switching circuit 41 includes semiconductor switching elements Q11 to Q14 connected in a single-phase full bridge, and freewheeling diodes D11 to D14 connected to semiconductor switching elements Q11 to Q14 in antiparallel.

Similarly, second switching circuit 42 is connected between secondary side DC nodes 12a and 12b and secondary side AC nodes 82a and 82b. Second switching circuit 42 includes semiconductor switching elements Q21 to Q24 connected in a single-phase full bridge, and freewheeling diodes D21 to D24 connected to semiconductor switching elements Q21 to Q24 in antiparallel.

Semiconductor switching elements Q11 to Q14 and Q21 to Q24 can each be composed of a self arc-extinguishing switching element such as an IGBT (Insulated Gate Bipolar Transistor). Turning on/off semiconductor switching elements Q11 to Q14 and Q21 to Q24 can be controlled by control signals S11 to S14 and S21 to S24, respectively, issued from control circuit 45.

Turning on/off semiconductor switching elements Q11 to Q14 is controlled so as to perform power conversion (DC/AC conversion) between DC voltage Vc1 of primary side DC nodes 11a and 11b and AC voltage (single phase) V41 of primary side AC nodes 81a and 81b. Similarly, turning on/off semiconductor switching elements Q21 to Q24 is controlled so as to perform power conversion (AC/DC conversion) between AC voltage (single phase) V42 of secondary side AC nodes 82a and 82b and DC voltage Vc2 of secondary side DC nodes 12a and 12b. Thus, converter cell 10 is configured as a so-called single-phase DAB (Dual-Active Bridge) that converts DC voltage to DC voltage via single-phase AC voltage transmitted via insulation by transformer 8. First switching circuit 41 corresponds to an embodiment of a "first power conversion unit" and second switching circuit 42 corresponds to an embodiment of a "second power conversion unit."

In converter cell 10 of FIG. 2, turning on/off semiconductor switching elements Q11 to Q14 and Q21 to Q24 can be controlled to control AC voltages V41 and V42 in amplitude and phase to control power transmission between the primary side and the secondary side in amount and direction, as desired. This is done in a known method, which is described for example in NPL 1.

Further, by outputs of temperature sensors (not shown) disposed at semiconductor switching elements Q11 to Q14 and Q21 to Q24 and freewheeling diodes D11 to D14 and D21 to D24, control circuit 45 can detect temperatures TQ11 to TQ14 and TQ21 to TQ24 of semiconductor switching elements Q11 to Q14 and Q21 to Q24 and temperatures TD11 to TD14 and TD21 to TD24 of freewheeling diodes D11 to D14 and D21 to D24. Furthermore, disposing a voltage sensor (not shown) for capacitors 6 and 7 enables control circuit 45 to detect DC voltages Vc1 and Vc2. Similarly, disposing a current sensor (not shown) for transformer 3 enables control circuit 45 to also detect an AC current (single phase) passing through transformer 3.

Figure 3:
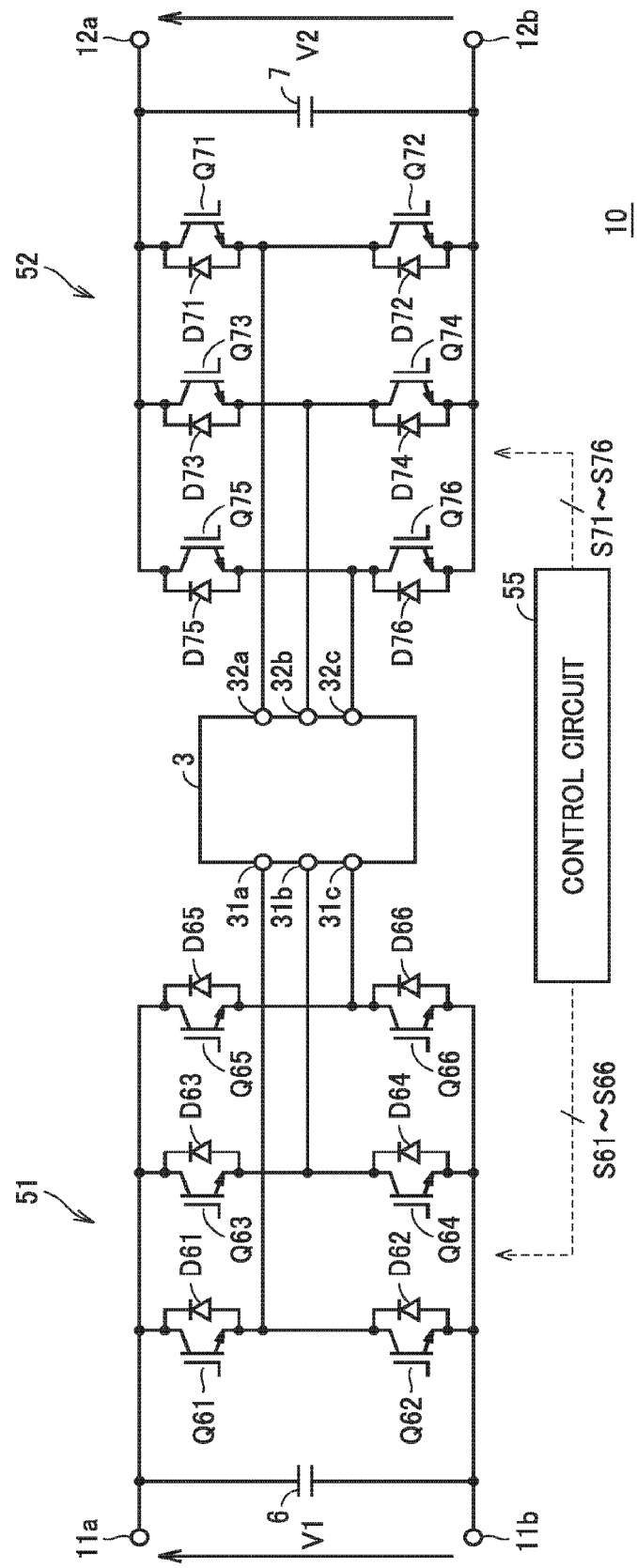
FIG. 3 is a circuit diagram for illustrating a second example configuration of the converter cell shown in FIG. 1.

FIG. 3 shows a second example configuration of converter cell 10 shown in FIG. 1. Referring to FIG. 3, converter cell 10 according to the second example configuration includes a three-phase transformer 3, capacitors 6 and 7, a first switching circuit 51, a second switching circuit 52, and a control circuit 55. As well as control circuit 45, control circuit 55 can also have its functions implemented by dedicated hardware and/or software processing by executing a program.

Transformer 3 includes a three-phase primary side winding (not shown) connected to primary side AC nodes 31a, 31b, 31c and a three-phase secondary side winding (not shown) connected to secondary side AC nodes 32a, 32b, 32c. Capacitor 6 is connected between primary side DC nodes 11a and 11b and capacitor 7 is connected between secondary side DC nodes 12a and 12b, similarly as shown in FIG. 2.

First switching circuit 51 is connected between primary side DC nodes 11a, 11b and secondary side AC nodes 32a, 32b, 32c. First switching circuit 51 includes semiconductor switching elements Q61 to Q66 connected in a three-phase full bridge, and freewheeling diodes D61 to D66 connected to semiconductor switching elements Q61 to Q66 in antiparallel.

Similarly, second switching circuit 52 is connected between secondary side DC nodes 12a, 12b and secondary side AC nodes 32a, 32b, 32c. Second switching circuit 52 includes semiconductor switching elements Q71 to Q76 connected in a three-phase full bridge, and freewheeling diodes D71 to D76 connected to semiconductor switching elements Q71 to Q76 in antiparallel.

Semiconductor switching elements Q61 to Q66 and Q71 to Q76 can each also be composed of a self arc-extinguishing switching element such as an IGBT (Insulated Gate Bipolar Transistor). Turning on/off semiconductor switching elements Q61 to Q66 and Q71 to Q76 can be controlled by control signals S61 to S66 and S71 to S76, respectively, issued from control circuit 55.

Turning on/off semiconductor switching elements Q61 to Q66 is controlled so as to perform power conversion (DC/AC conversion) between DC voltage Vc1 of primary side DC nodes 11a and 11b and AC voltage (three phases) of primary side AC nodes 31a, 31b, 31c. Similarly, turning on/off semiconductor switching elements Q71 to Q76 is controlled so as to perform power conversion (AC/DC conversion) between AC voltage (three phases) of secondary side AC nodes 32a, 32b, 32c and DC voltage Vc2 of secondary side DC nodes 12a and 12b. Thus, converter cell 10 is configured as a so-called 3-phase DAB (Dual-Active Bridge) that converts DC voltage to DC voltage via 3-phase AC voltage transmitted via insulation by transformer 3. First switching circuit 51 corresponds to an embodiment of the "first power conversion unit," and second switching circuit 52 corresponds to an embodiment of the "second power conversion unit."

In converter cell 10 of FIG. 3 as well, turning on/off semiconductor switching elements Q61 to Q66 and Q71 to Q76 can be controlled to control 3-phase AC voltage in amplitude and phase to control power transmission between the primary side and the secondary side in amount and direction, as desired. This is done in a known method, which is described for example in NPL 1.

In the configuration of FIG. 3 as well, by outputs of temperature sensors disposed at semiconductor switching elements Q61 to Q66, Q71 to Q76 and freewheeling diodes D61 to D66 and D71 to D76, control circuit 55 can detect temperatures TQ61 to TQ66 and TQ71 to TQ76 of semiconductor switching elements Q61 to Q66 and Q71 to Q76 and temperatures TD61 to TD66 and TD71 to TD76 of freewheeling diodes D61 to D66 and D71 to D76. It is also possible to dispose a voltage sensor (not shown) for capacitors 6 and 7 and dispose a current sensor (not shown) for transformer 8. Thereby, control circuit 45 can further detect DC voltages Vc1 and Vc2 and an AC current (three phases) passing through transformer 8.

Referring to FIG. 1 again, in power conversion device 100a according to the first example, on the primary side, a plurality of converter cells 10 each have primary side DC nodes 11a and 11b connected to primary side DC terminals 1a and 1b in parallel. On the secondary side of power conversion device 100a, the plurality of converter cells 10 have secondary side DC nodes 12a and 12b connected in series between secondary side DC terminals 2a and 2b.

Thereby, in power conversion device 100a, while power of a large current can be handled on the primary side, power of high voltage can be handled on the secondary side. Furthermore, DC power of low voltage can be converted to DC power of high voltage.

Figure 4:
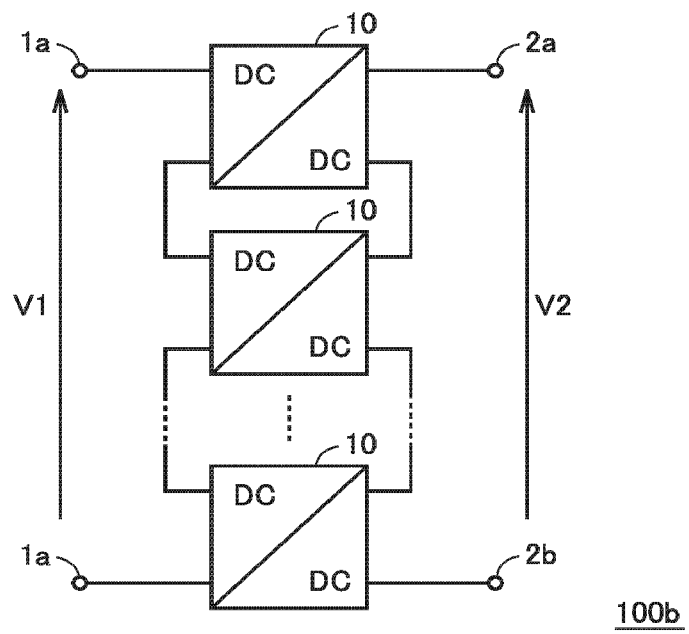
FIG. 4 is a block diagram for illustrating a second example of the power conversion device which is a test target.

FIG. 4 is a block diagram for illustrating a second example of a power conversion device which is a test target. Referring to FIG. 4, a power conversion device 100b according to the second example is similar to power conversion device 100a, that is, it includes primary side DC terminals 1a and 1b, secondary side DC terminals 2a and 2b, and a plurality of converter cells 10. In power conversion device 100b, the plurality of converter cells 10 are connected in series on both the primary side and the secondary side.

Specifically, on the primary side of power conversion device 100b, the plurality of converter cells 10 each have primary side DC nodes 11a and 11b connected in series between primary side DC terminals 1a and 1b. On the secondary side of power conversion device 100b as well, the plurality of converter cells 10 have secondary side DC nodes 12a and 12b connected in series between secondary side DC terminals 2a and 2b. Thereby, DC voltage of high voltage can be handled on both the primary side and the secondary side. Note that, by setting a ratio of turns of 1:1 for the primary side winding and the secondary side winding of transformers 3 and 8 in each converter cell 10, in power conversion device 100b, DC voltage between primary side DC terminals 1a and 1b and DC voltage between secondary side DC terminals 2a and 2b will be equivalent.

Figure 5:
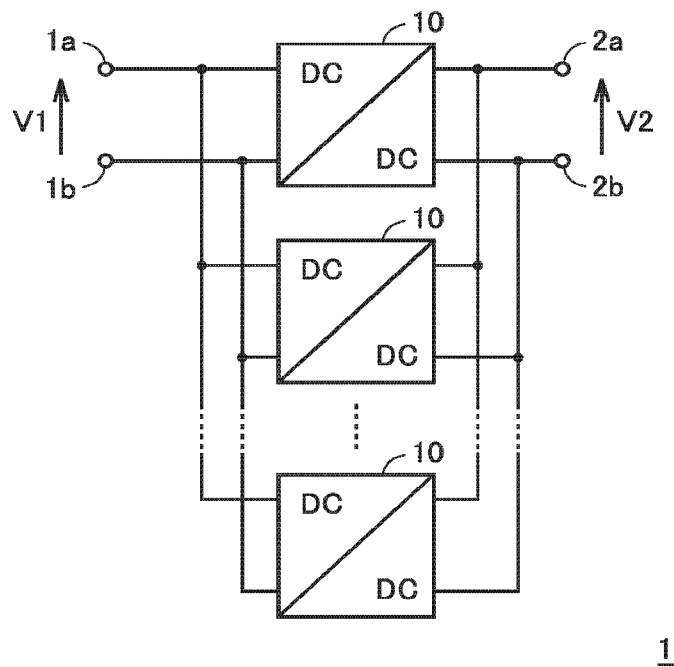
FIG. 5 is a block diagram for illustrating a third example of the power conversion device which is a test target.

FIG. 5 is a block diagram for illustrating a third example of a power conversion device which is a test target. Referring to FIG. 5, a power conversion device 100c according to the third example is similar to power conversion devices 100a and 100b, that is, it includes primary side DC terminals 1a and 1b, secondary side DC terminals 2a and 2b, and a plurality of converter cells 10. In power conversion device 100c, the plurality of converter cells 10 are connected in parallel on both the primary side and the secondary side.

Specifically, on the primary side of power conversion device 100c, the plurality of converter cells 10 each have primary side DC nodes 11a and 11b connected to primary side DC terminals 1a and 1b in parallel. On the secondary side of power conversion device 100c as well, the plurality of converter cells 10 have secondary side DC nodes 12a and 12b connected to secondary side DC terminals 2a and 2b in parallel. Thereby, DC voltage of a large current can be handled on both the primary side and the secondary side. Note that, by setting a ratio of turns of 1:1 for the primary side winding and the secondary side winding of transformers 3 and 8 in each converter cell 10, in power conversion device 100c as well, DC voltage between primary side DC terminals 1a and 1b and DC voltage between secondary side DC terminals 2a and 2b will be equivalent.

Figure 6:
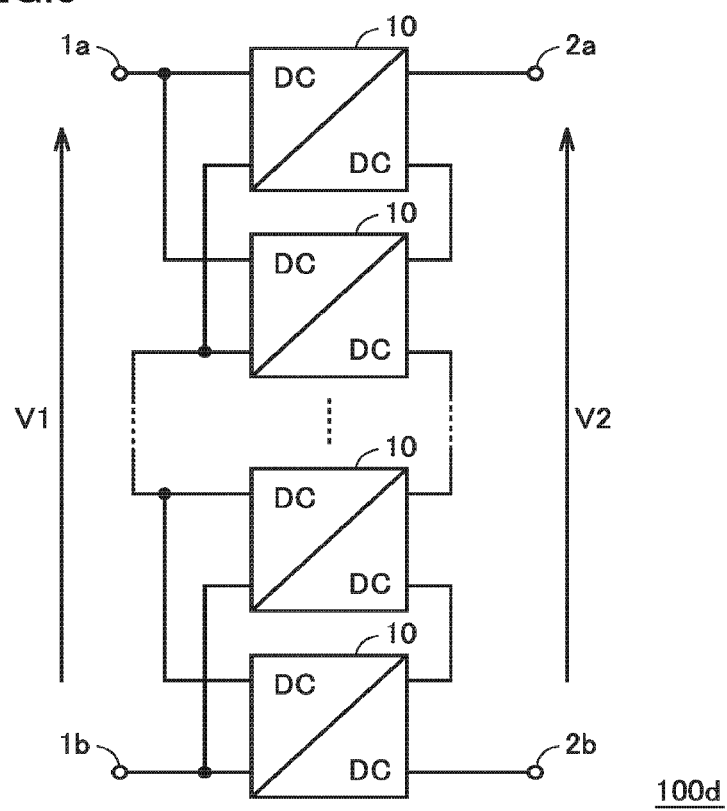
FIG. 6 is a block diagram for illustrating a fourth example of the power conversion device which is a test target.

FIG. 6 is a block diagram for illustrating a fourth example of a power conversion device which is a test target. Referring to FIG. 6, a power conversion device 100d according to the third example is similar to power conversion devices 100a to 100c, that is, it includes primary side DC terminals 1a and 1b, secondary side DC terminals 2a and 2b, and a plurality of converter cells 10.

On the secondary side of power conversion device 100d, as well as power conversion device 100b (see FIG. 4), the plurality of converter cells 10 have secondary side DC nodes 12a and 12b connected in series between secondary side DC terminals 2a and 2b. In contrast, on the primary side of power conversion device 100d, every two converter cells 10 have primary side DC nodes 11a and 11b connected in parallel, and furthermore, primary side DC nodes 11a and 11b of every two converter cells 10 that are connected in parallel are connected in series between primary side DC terminals 1a and 1b. That is, on the primary side, the plurality of converter cells 10 are connected in series-parallel.

Thereby, on the primary side of power conversion device 100d, intermediate DC voltage higher than the primary side of power converter (see FIG. 5) 100c and lower than power conversion device 100b (see FIG. 4) can be handled by using the same number of converter cells 10. And the intermediate DC voltage on the primary side can be converted on the secondary side to high voltage equivalent to that of power conversion device 100b.

In the present embodiment, power conversion device 100 having a plurality of converter cells 10, including power conversion devices 100a to 100d described with reference to in FIGS. 1 and 4 to 6, are test targets. That is, power conversion device 100 includes power conversion devices 100a to 100d described above, and includes a plurality of converter cells 10 arranged in any number in any connection manner (series, parallel, or series-parallel).

In power conversion device 100, depending on the number of converter cells 10 and how they are connected, DC voltage V1 between primary side DC terminals 1a and 1b and DC voltage V2 between secondary side DC terminals 2a and 2b can be set, as desired, to convert DC power of various voltages to DC power of other various voltages. Furthermore, as has been described with reference to FIGS. 4 and 5, it is also possible to set V1=V2.

(Configuration of Test System)

Figure 7:
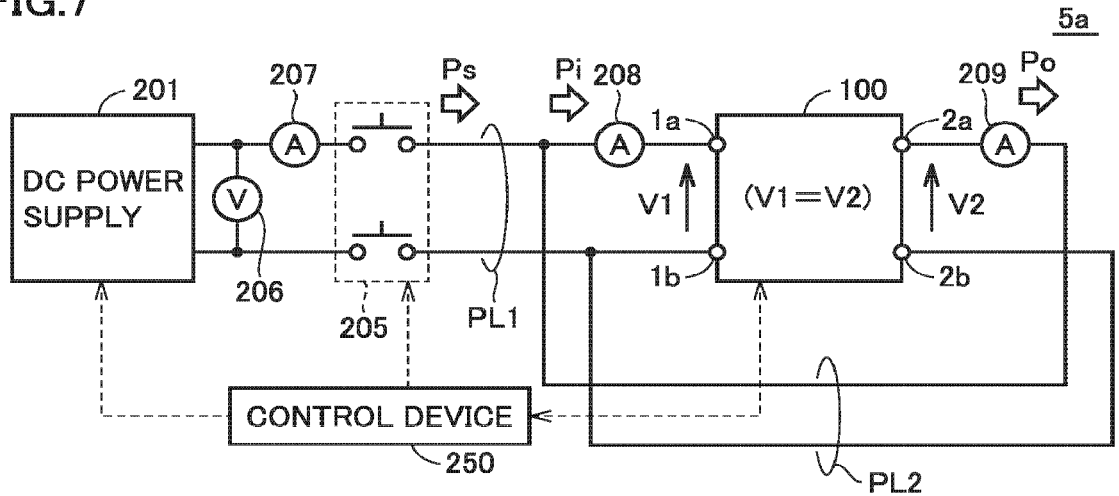
FIG. 7 is a block diagram for illustrating an example configuration of a system to test a power conversion device according to a first embodiment.

FIG. 7 is a block diagram for illustrating an example configuration of a test system 5a to test a power conversion device according to the first embodiment.

Referring to FIG. 7, test system 5a tests power conversion device 100 with V1=V2. In other words, power conversion device 100 shown in FIG. 7 is an embodiment of a "first power conversion device."

Test system 5a includes a DC power supply 201 which is an example of the "testing power supply," a testing circuit breaker 205, measuring instruments 206 to 209, power cables PL1 and PL2, and a control device 250. In power conversion device 100 which is the test target of test system 5a, primary side DC terminals 1a and 1b correspond to an "input side" and secondary side DC terminals 2a and 2b correspond to an "output side."

Power cable PL1 electrically connects DC power supply 201 and primary side DC terminals 1a and 1b of power conversion device 100. Power cable PL2 has one end connected to secondary side DC terminals 2a and 2b of power conversion device 100 and the other end electrically connected to power cable PL1. Thereby, power cable PL2 electrically connects secondary side DC terminals 2a and 2b of power conversion device 100 and DC power supply 201. That is, power cable PL1 corresponds to an embodiment of a "first connection member" and power cable PL2 corresponds to an embodiment of a "second connection member."

Circuit breaker 205 is connected in series with power cable PL1. Circuit breaker 205 has a protective function to interrupt or form a current path in response to an open/close command received from control device 250 and automatically interrupt the current path when a value of a current exceeds a predetermined reference value.

Measuring instrument 206 detects output voltage (power supply voltage) of DC power supply 201. Measuring instrument 207 measures an output current (a power supply current) of DC power supply 201. Measuring instrument 208 is connected to power cable PL1 and measures a current passing through primary side DC terminals 1a and 1b. Measuring instrument 209 is connected to power cable PL2 and measures a current passing through secondary side DC terminals 2a and 2b. Measurement values obtained by measuring instruments 206 to 209 are input to control device 250. Control circuit 250 can also have its functions configured by dedicated hardware such as an analog circuit, an ASIC or the like. Alternatively, control circuit 250 may be composed of a microcomputer or the like having a computing function and have its functions partially or entirely implemented by software processing by a processor (not shown) executing a program installed in a memory (not shown).

Further, control device 250 can generate a command value for DC power supply 201, a command to open/close circuit breaker 205, and a command value for power conversion device 100. Thereby, in testing power conversion device 100, an output of DC power supply 201, opening/closing circuit breaker 205, and an operation in power conversion device 100 (for example, turning on/off the semiconductor switching elements constituting converter cell 10) can be controlled. Further, a value detected in power conversion device 100, e.g., a value in temperature detected in testing the semiconductor switching elements and the freewheeling diodes, as has been described with reference to FIGS. 3 and 4, can also be input to control device 250.

When testing power conversion device 100 in test system 5a, power output from secondary side DC terminals 2a and 2b of power conversion device 100 is transmitted to primary side DC terminals 1a and 1b of power conversion device 100 through power cable PL2 to be a part of power input to power conversion device 100. Therefore, between active power Pi input to primary side DC terminals 1a and 1b of power conversion device 100, active power Po output from secondary side DC terminals 2a and 2b of power conversion device 100, and active power Ps supplied from DC power supply 201, the following equation (1) is established:

$$Ps + Po = Pi \quad (1).$$

From equation (1), Ps=Pi−Po. Pi−Po corresponds to power loss in power conversion device 100, and it is understood that this power loss is equivalent to active power Ps supplied from DC power supply 201. Active power Ps can be measured using measuring instruments 206 and 207. Similarly, active power Pi can be measured using measuring instruments 206 and 208, and active power Po can be measured using measuring instruments 206 and 209.

Thus, test system 5a according to the first embodiment can test power conversion device 100 by supplying active power Ps smaller than active power Po passing through power conversion device 100. This allows a testing power supply (DC power supply 201), circuit breaker 205, and measuring instrument 207 to have reduced rated capacities. As a result, test system 5a can be reduced in size and cost, and power conversion device 100 can be efficiently tested.

Hereinafter, an operation of each converter cell 10 in testing power conversion device 100 will be described in detail.

Figure 8:
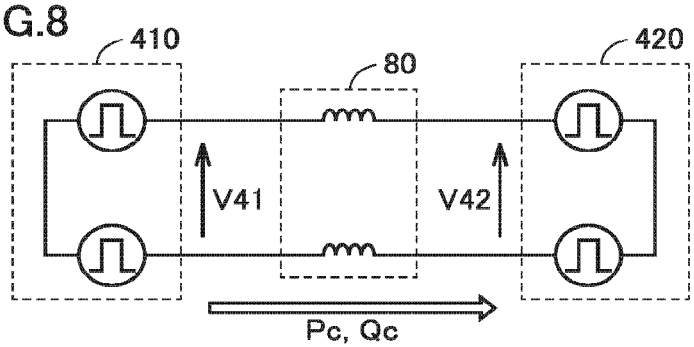
FIG. 8 is a conceptual diagram for illustrating an operation of a converter cell shown in FIG. 2 when a test is conducted.

FIG. 8 is a conceptual diagram for illustrating an operation of converter cell 10 shown in FIG. 2 when a test is conducted. FIG. 8 shows an AC equivalent circuit of a single-phase DAB.

Referring to FIG. 8, an equivalent voltage source 410 is configured by turning on/off semiconductor switching elements Q11 to Q14 in first switching circuit 41. Equivalent voltage source 410 outputs AC voltage (line voltage) V41 to primary side AC nodes 81a and 81b of transformer 8, as has been shown in FIG. 2. Similarly, an equivalent voltage source 420 is configured by turning on/off semiconductor switching elements Q21 to Q24 in second switching circuit 42. Equivalent voltage source 420 outputs AC voltage (line voltage) V42 to secondary side AC nodes 82a and 82b of transformer 8, as has been shown in FIG. 2.

Equivalent voltage sources 410 and 420 are equivalently connected via an equivalent inductance 80. Equivalent inductance 80 corresponds to leakage inductance of transformer 8. Alternatively, when an inductor is additionally connected in series with transformer 8, the inductance of the inductor is also included in equivalent inductance 80.

In the equivalent circuit of FIG. 8, line voltages V41 and 42 can be controlled in phase and amplitude, as desired, by controlling turning on/off semiconductor switching elements Q11 to Q14 in first switching circuit 41 and semiconductor switching elements Q21 to Q24 in second switching circuit 42.

By controlling a phase difference between line voltage V41 and line voltage V42, active power Pc passing through converter cell 10 can be controlled. Accordingly, by control circuit 45, control signals S11 to S14 and S21 to S24 can be generated to implement a switching pattern for semiconductor switching elements Q11 to Q14 and Q21 to Q24 for causing a phase difference following a command value for active power Pc.

Further, reactive power Qc generated in converter cell 10 can be controlled by controlling an amplitude difference between line voltage V41 and line voltage V42. Accordingly, by control circuit 45, control signals S11 to S14 and S21 to S24 can be generated to implement a switching pattern for semiconductor switching elements Q11 to Q14 and Q21 to Q24 for causing an amplitude difference following a command value for reactive power Qc.

Alternatively, control signals S11 to S14 and S21 to S24 can be generated to control a switching pattern for semiconductor switching elements Q11 to Q14 and Q21 to Q24 in accordance with a combination of the command value for active power Pc and the command value for reactive power Qc.

In test system 5a of FIG. 7, capacitors 6 and 7 are connected in parallel by power cables PL1 and PL2 and thus equal in voltage. In that case, one of first switching circuit 41 and second switching circuit 42 performs a zero voltage output operation. Specifically, in the zero voltage output operation, in first switching circuit 41, while semiconductor switching elements Q11, Q13 (or Q12, Q14) are turned on, semiconductor switching elements Q12, Q14 (or Q11, Q13) are turned off to zero a voltage difference between AC nodes 81a and 81b. Similarly, in second switching circuit 42, in the zero voltage output operation, while semiconductor switching elements Q21 and Q23 (or Q22 and Q24) are turned on, semiconductor switching elements Q22 and Q24 (or Q21 and Q23) are turned off to zero a voltage difference between secondary side AC nodes 82a and 82b.

Further, in the other of first switching circuit 41 and second switching circuit 42 a normal operation for outputting AC voltage (single phase) controlled in phase and amplitude can be performed to cause an amplitude difference between line voltage V41 and line voltage V42. Thus, reactive power Qc can also be generated in each converter cell 10 when a test is conducted in test system 5a of FIG. 7.

Figure 9:
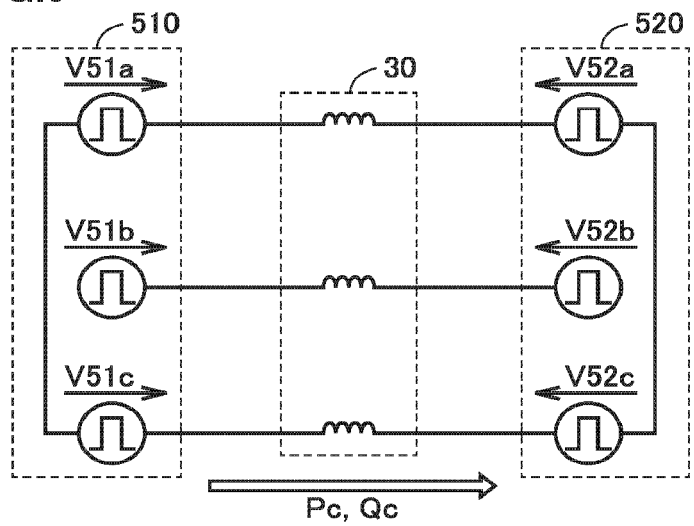
FIG. 9 is a conceptual diagram for illustrating an operation of a converter cell shown in FIG. 3 when a test is conducted.

FIG. 9 is a conceptual diagram for illustrating an operation of converter cell 10 shown in FIG. 3 when a test is conducted. FIG. 9 shows an AC-side equivalent circuit of a three-phase DAB.

Referring to FIG. 9, an equivalent voltage source 510 is configured by turning on and off semiconductor switching elements Q61 to Q66 in first switching circuit 51. Equivalent voltage source 510 outputs AC voltages (line voltages) V51a to V51c to primary side AC nodes 31a, 31b, 31c of transformer 3, as has been shown in FIG. 2. AC voltages (line voltages) V51a to V51c have a phase difference by 120 degrees.

Similarly, an equivalent voltage source 520 is configured by turning on and off semiconductor switching elements Q71 to Q76 in second switching circuit 52. Equivalent voltage source 520 outputs AC voltages (phase voltages) V52a to V52c to secondary side AC nodes 32a, 32b, 32c of transformer 3, as shown in FIG. 2. AC voltages (phase voltages) V52a to V52c have a phase difference by 120 degrees.

Equivalent voltage sources 510 and 520 are equivalently connected via an equivalent inductance 30. Equivalent inductance 30 corresponds to leakage inductance of transformer 3. Alternatively, when an inductor is additionally connected in series with transformer 3, the inductance of the inductor is also included in equivalent inductance 30.

In the equivalent circuit of FIG. 9, phase voltages V51a to V51c can be controlled in phase and amplitude, as desired, by controlling turning on/off semiconductor switching elements Q61 to Q66 in first switching circuit 51. Similarly, phase voltages V52a to V52c can be controlled in phase and amplitude, as desired, by controlling turning on/off semiconductor switching elements Q71 to Q76 in second switching circuit 52.

In the 3-phase DAB circuit of FIG. 3 as well, by controlling a phase difference of phase voltages V51a to V51c and phase voltages V52a to V52c, active power Pc passing through converter cell 10 can be controlled. Similarly, by controlling an amplitude difference of phase voltages V51a to V51c and phase voltages V52a to V52c, reactive power Qc passing through converter cell 10 can be controlled.

Accordingly, by control circuit 55, control signals S61 to S66 and S71 to S76 can be generated to implement a switching pattern for semiconductor switching elements Q61 to Q66 and Q71 to Q76 for causing a phase difference and/or an amplitude difference following a command value for at least one of active power Pc and reactive power Qc.

Note that in converter cell 10 of FIG. 3, when first switching circuit 51 performs a zero voltage operation, while semiconductor switching elements Q61, Q63, Q65 (or Q62, Q64, Q66) are turned on, semiconductor switching elements Q62 Q64, Q66 (or Q61, Q63, Q65) are turned off to zero a voltage difference among primary side AC nodes 31a to 31c. Similarly, when second switching circuit 52 performs a zero voltage output operation, while semiconductor switching elements Q71, Q73, Q75 (or Q72, Q74, Q76) are turned on, semiconductor switching elements Q72, Q74, Q76 (or Q71, Q73, Q75) are turned off to zero a voltage difference among secondary side AC nodes 32a to 32c.

That is, in test system 5a of FIG. 7, even when power conversion device 100a including converter cell 10 of FIG. 3 is a test target, reactive power Qc can be generated in each converter cell 10 by performing a zero voltage output operation in one of first switching circuit 51 and second switching circuit 52 and performing a normal operation in the other of first switching circuit 51 and second switching circuit 52 for outputting AC voltage (three phases) controlled in phase and amplitude.

Referring to FIG. 7 again, in test system 5a, controllability of active power of power conversion device 100 and power loss of power conversion device 100 can be measured by measuring active power Pi input to primary side DC terminals 1a and 1b, active power Po output from secondary side DC terminals 2a and 2b, and active power Ps supplied from testing DC power supply 201 as shown in FIG. 7 in a state in which active power Pc of each converter cell 10 is controlled in response to a command value issued from control device 250, as has been described with reference to FIGS. 8 and 9.

Further, in test system 5a, controllability of power conversion device 100 and whether an overcurrent is generated can be confirmed by measuring an AC current sensed by a current sensor disposed at transformer 3 (see FIG. 2) or transformer 8 (see FIG. 3).

Further, in test system 5a, whether a balance of currents of converter cells 10 can also be confirmed by measuring currents of primary side DC nodes 11a and 11b and secondary side DC nodes 12a and 12b of the plurality of converter cells 10. Further, whether a balance of voltages of converter cells 10 can also be confirmed by measuring the voltages of capacitors 6, 7 of the plurality of converter cells 10 (i.e., DC voltages Vc1, Vc2).

Furthermore, in test system 5a, by conducting a heat run test by measuring the temperature of the semiconductor switching elements and freewheeling diodes constituting each converter cell 10, it can be confirmed whether the temperature falls within a range lower than a tolerable value. For example, the tolerable value in the heat run test can be set to about 125 to 150° C.

In the heat run test, it is not a requirement to control active power, and it is possible to conduct the heat run test in a state with reactive power Qc controlled. Reactive power is power which is generated inside power conversion device 100 and does not flow out of power conversion device 100.

Note that total power Pt passing through power conversion device 100 corresponds to the square root of the sum of the square of active power Pc and the square of reactive power Qc (i.e., $Pt=(Pc^2+Qc^2)^{1/2}$) Therefore, according to test system 5a, active power Ps supplied from a testing power supply (DC power supply 201) is smaller than total power Pt passing through power conversion device 100.

That is, by generating reactive power, active power that testing DC power supply 201 supplies can be reduced, so that the rated capacities of the testing power supply (DC power supply 201), circuit breaker 205, and measuring instruments 207 to 209 can further be reduced, and the rated capacities of power cables PL1 and PL2 for connection for testing can also be reduced.

As described above, reactive power can be easily generated by controlling turning on/off the semiconductor switching elements in each converter cell 10. As the reactive power is increased, the above effect is extended. For example, the reactive power in a test target or power conversion device 100 can be made larger than the active power passing through power conversion device 100.

Modification of the First Embodiment

Figure 10:
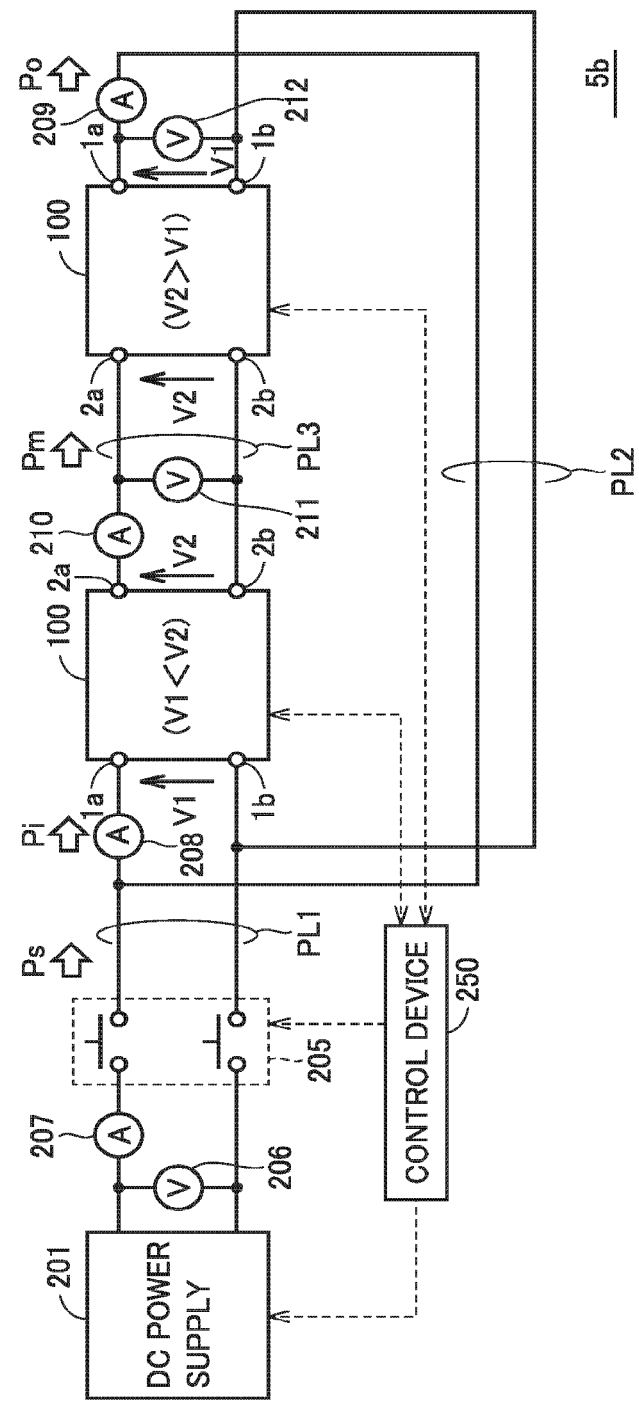
FIG. 10 is a block diagram for illustrating an example configuration of a system to test a power conversion device according to a modification of the first embodiment.

FIG. 10 is a block diagram for illustrating an example configuration of a test system 5b to test a power conversion device according to a modification of the first embodiment.

Referring to FIG. 10, in test system 5b, two power conversion devices 100 with V1≠V2 are handled as a set as a test target. That is, power conversion device 100 shown in FIG. 10 is an embodiment of a "second power conversion device."

Note that in FIG. 10, it is assumed that V1<V2. Further, in the following description, of the two power conversion devices 100, one located on the left side in FIG. 10 will also be referred to as a preceding stage's power conversion device 100, and the other one located on the right side in FIG. 10 will also be referred to as a following stage's power conversion device 100.

Power cable PL1 electrically connects DC power supply 201 and primary side DC terminals 1a and 1b of the preceding stage's power conversion device 100. Power cable PL2 has one end connected to secondary side DC terminals 2a and 2b of the following stage's power conversion device 100 and the other end electrically connected to power cable PL1. Power cable PL3 connects secondary side DC terminals 2a and 2b of the two power conversion devices 100 that input and output DC voltage V2.

In test system 5b of FIG. 10, primary side DC terminals 1a and 1b of the preceding stage's power conversion device 100 correspond to an input side of a test target, and primary side DC terminals 1a and 1b of the following stage's power conversion device 100 correspond to an output side of the test target. Therefore, in test system 5b as well, power cable PL1 corresponds to an embodiment of the "first connection member," and power cable PL2 corresponds to an embodiment of the "second connection member."

Circuit breaker 205 and measuring instruments 206 and 207 are connected to power cable PL1 similarly as done in test system 5a. For power cable PL1, a measuring instrument 208 is further provided for measuring a current of primary side DC terminals 1a and 1b of the preceding stage's power conversion device 100. Furthermore, for power cable PL3, measuring instruments 210 and 211 are provided for measuring a DC current and a DC voltage (V2), and for power cable PL2, measuring instruments 209 and 212 are provided for measuring a DC current and a DC voltage (V1).

Measurement values obtained by measuring instruments 206 to 212 are input to control device 250. Active power Ps can be measured by measuring instruments 206 and 207, active power Pi can be measured by measuring instruments 206 and 208, active power Pm can be measured by measuring instruments 210 and 211, and active power Po can be measured by measuring instruments 209 and 212.

In addition to the function described for test system 5a, control device 250 can generate a command value for each of the preceding and following stages' power conversion devices 100 for controlling an operation (i.e., power conversion). The command value includes the command values for active power Pc and reactive power Qc described in the first embodiment. In addition, the values of temperature, voltage, and a current sensed, as have been described in the first embodiment, can be obtained from control circuits 45 and 55 for each power conversion device 100.

In test system 5b, the preceding stage's power conversion device 100 operates, as controlled, to increase DC voltage V1 input to primary side DC terminals 1a and 1b and output DC voltage V2 from secondary side DC terminals 2a and 2b. In contrast, the following stage's power conversion device 100 operates, as controlled, to decrease DC voltage V2 input to secondary side DC terminals 2a and 2b and output DC voltage V1 from primary side DC terminals 1a and 1b. Further, at least one of active power Pc and reactive power Qc is controlled in each of the preceding and following stages' power conversion devices 100.

When power conversion device 100 is tested in test system 5b, for active power Pi input from testing DC power supply 201 to primary side DC terminals 1a and 1b of the preceding stage's power conversion device 100, active power Pm is output from secondary side DC terminals 2a and 2b of the preceding stage's power conversion device 100 and input to secondary side DC terminals 2a and 2b of the following stage's power conversion device 100. Active power Po output from primary side DC terminals 1a and 1b of the following stage's power conversion device 100 is transmitted by power cable PL2 and will be a part of power input to the preceding stage's power conversion device 100.

Therefore, active power Ps supplied from AC power supply 301 will be Ps=Pi−Po. In FIG. 10, Pi−Pm corresponds to power lost in the preceding stage's power conversion device 100, and Pm−Po corresponds to power lost in the preceding stage's power conversion device 100. Therefore, it is understood that active power Ps (Ps=Pi−Po) supplied from DC power supply 201 is equivalent to power lost in both the preceding and following-stages' power conversion devices 100.

Thus, test system 5b according to a modification of the first embodiment can test a power conversion device by supplying active power Ps smaller than active power Po passing through a test target which is power conversion device 100 having different input and output voltages. This allows a testing power supply (DC power supply 201), circuit breaker 205, and measuring instrument 207 to have reduced rated capacities. As a result, test system 5b can be reduced in size and cost, and power conversion device 100 having different input and output voltages can be efficiently tested.

Furthermore, the preceding stage's power conversion device 100 in a configuration in which primary side DC terminals 1a and 1b on the lower-voltage side (V1<V2) are connected to the testing power supply (DC power supply 201) allows a power supply having a low rated voltage to be used as the testing power supply (DC power supply 201). Furthermore, withstand voltage required for the testing power supply and power cables PL1 and PL2 is reduced, and test system 5b can further be reduced in size and cost by reducing an insulating member in size.

The test conducted at each power conversion device 100 has specific contents which are similar to those in the first embodiment, including a heat run test and generation of reactive power, and accordingly, will not be described repeatedly in detail.

Further, in test system 5b, a power conversion operation in the preceding stage's power conversion device 100 in a direction in which primary side DC terminals 1a and 1b are an input and secondary side DC terminals 2a and 2b are an output, and a power conversion operation in the following stage's power conversion device 100 in a direction in which secondary side DC terminals 2a and 2b are an input and primary side DC terminals 1a and 1b are an output, can both be tested simultaneously. This allows the test to be conducted in a reduced period of time.

Further, of the two power conversion devices 100, the preceding stage's power conversion device 100 can control DC voltage V2 of secondary side DC terminals 2a and 2b and the following stage's power conversion device 100 can control active power Po. Alternatively, while the following stage's power conversion device 100 can control DC voltage V2 of secondary side DC terminals 2a and 2b, the preceding stage's power conversion device 100 can control active power Pm. Thus, in a test of a power conversion device using test system 5b, it is also possible to simultaneously verify controllability of output voltage and controllability of output power (or active power) (e.g., control accuracy and control responsiveness) for a test target which is two power conversion devices 100.

Second Embodiment

In the second embodiment, a test system using an AC power supply as a testing power supply will be described.

Figure 11:
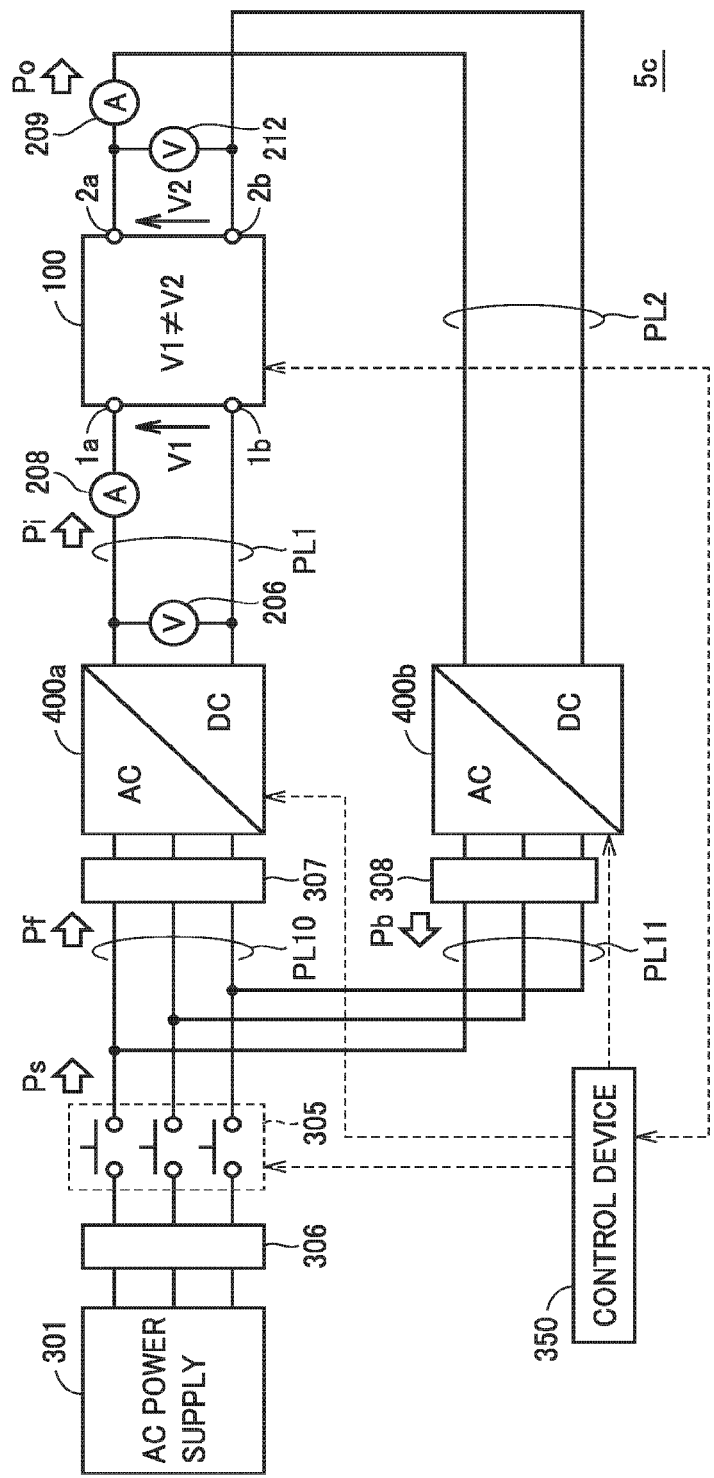
FIG. 11 is a block diagram for illustrating an example configuration of a system to test a power conversion device according to a second embodiment.

FIG. 11 is a block diagram for illustrating an example configuration of a test system 5c to test a power conversion device according to the second embodiment.

Referring to FIG. 11, test system 5c includes AC power supply 301, testing circuit breaker 305, measuring instruments 206, 208, 209, 212, 306 to 308, testing converters 400a and 400b, cables PL1, PL2, PL10, PL11, and a control device 350. Control circuit 350, as well as control circuit 250, can also have its functions configured by dedicated hardware such as an analog circuit, an ASIC or the like. Alternatively, control circuit 350 may be composed of a microcomputer or the like having a computing function and have its functions partially or entirely implemented by software processing by a processor (not shown) executing a program installed in a memory (not shown).

AC power supply 301 can be configured by a power supply device having a controllable output or an AC power system (for example, 6.6 kV). Testing converter 400a performs AC/DC conversion between AC voltage of AC power supply 301 and DC voltage V1 of primary side DC terminals 1a and 1b of power conversion device 100. Testing converter 400b performs DC/AC conversion between DC voltage V2 of secondary side DC terminals 2a and 2b of power conversion device 100 and AC voltage of AC power supply 301.

Figure 12:
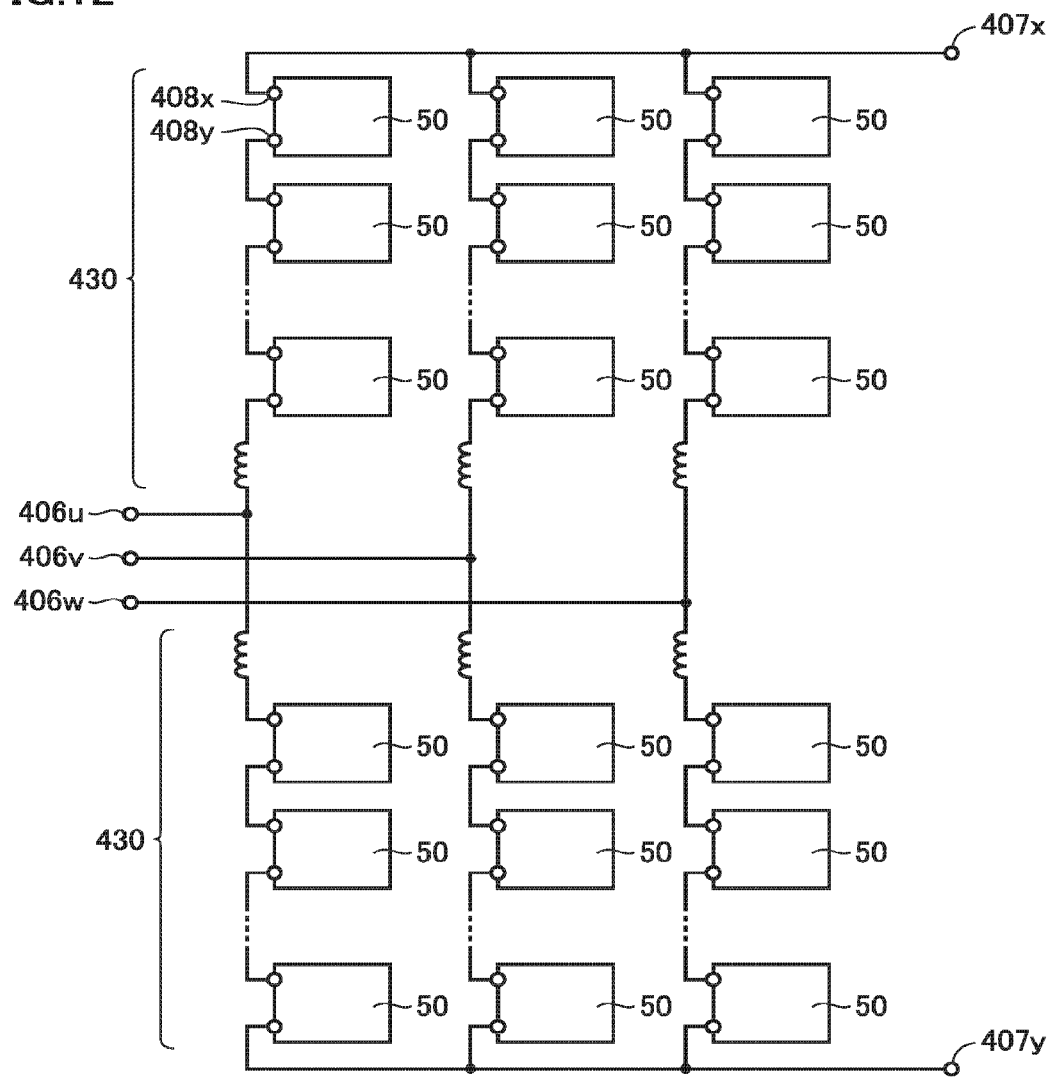
FIG. 12 is a block diagram for illustrating an example configuration of a testing converter shown in FIG. 11.

FIG. 12 shows an example configuration of testing converters 400a and 400b shown in FIG. 11. Testing converters 400a and 400b have the same configuration, and accordingly, hereinafter they will collectively, simply be referred to as a testing converter 400.

Referring to FIG. 12, testing converter 400 can be constituted by a modular multilevel converter which performs AC/DC power conversion or DC/AC power conversion bidirectionally between AC nodes 406u, 406v, 406v and DC nodes 407x, 407y.

In the modular multilevel converter, for each phase (U, V, W) of AC voltage, an arm circuit 430 in which a plurality of submodules 50 and a reactor are connected in series is arranged on each of a positive side and a negative side. In the example of FIG. 12, three arm circuits 430 for U, V, and W phases (for the positive side) are connected between AC nodes 406u, 406v, and 406v, respectively, and DC node 407x. Similarly, three arm circuits 430 for U, V, and W phases (for the negative side) are connected between AC nodes 406u, 406v, and 406v, respectively, and DC node 40'7y. In each arm circuit 430, a plurality of submodules 50 have output terminals 408x and 408y connected in series.

Figure 13:
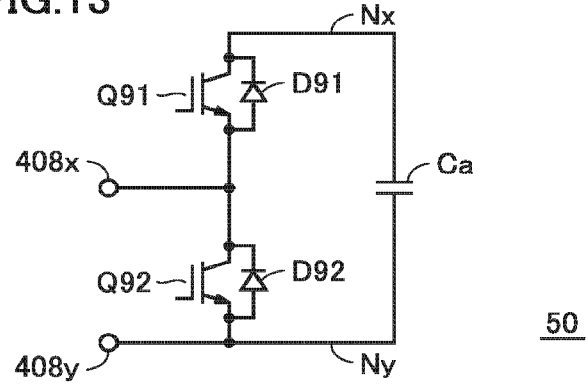
FIG. 13 is a circuit diagram for illustrating a first example configuration of a submodule shown in FIG. 12.

FIG. 13 shows a first example configuration of submodule 50 shown in FIG. 12. Referring to FIG. 13, submodule 50 according to the first example configuration has a so-called half-bridge configuration. Specifically, submodule 50 includes a pair of output terminals 408x and 408y, a capacitor Ca, semiconductor switching elements Q91 and Q92, and freewheeling diodes D91 and D92. Output terminal 408x, 408y is electrically connected to output terminal 408x, 408y of another submodule 50, AC node 406u, 406v, 406w, or DC node 407x, 407y for the series connection shown in FIG. 12.

Capacitor Ca is connected between node Nx and node Ny, semiconductor switching element Q91 is electrically connected between output terminal 408x and node Nx, and semiconductor switching element Q92 is electrically connected between output terminals 408x and 408y. Freewheeling diodes D91 and D92 are connected to semiconductor switching elements Q91 and Q92 in antiparallel.

In submodule 50 of FIG. 13, capacitor Ca is connected between output terminals 408x and 408y via semiconductor switching element Q91. Using voltage Vca of capacitor Ca, output voltage between output terminals 408x and 408y is controlled to +Vca or 0 by turning on and off semiconductor switching elements Q91 and Q92.

Figure 14:
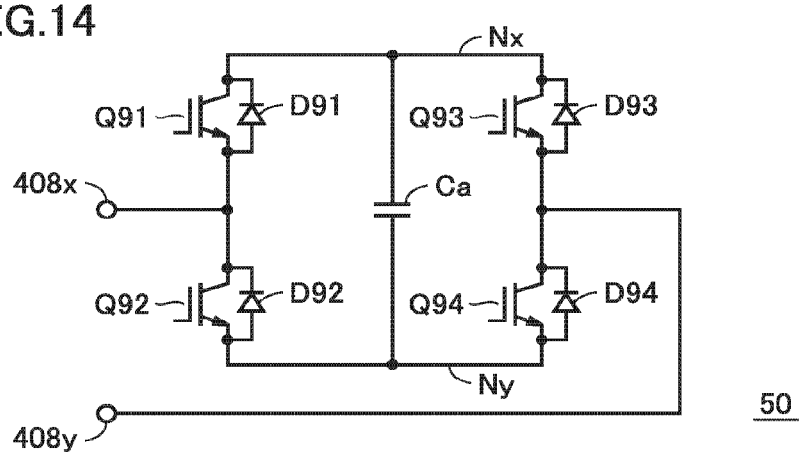
FIG. 14 is a circuit diagram for illustrating a second example configuration of the submodule shown in FIG. 12.

FIG. 14 shows a second example configuration of submodule 50 shown in FIG. 12. Referring to FIG. 14, submodule 50 according to the second example configuration has a so-called full bridge configuration. Specifically, submodule 50 includes a pair of output terminals 408x and 408y, capacitor Ca, semiconductor switching elements Q91 to Q94, and freewheeling diodes D91 to D94. Output terminal 408x, 408y is electrically connected to output terminal 408x, 408y of another submodule 50, AC node 406u, 406v, 406w, or DC node 407x, 407y.

Capacitor Ca is connected between nodes Nx and Ny. Semiconductor switching element Q91 is electrically connected between node Nx and output terminal 408x, and semiconductor switching element Q92 is electrically connected between output terminal 408x and node Ny. Similarly, semiconductor switching element Q93 is electrically connected between node Nx and output terminal 408y, and semiconductor switching element Q94 is electrically connected between output terminal 408y and node Ny. Freewheeling diodes D91 to D94 are connected to semiconductor switching elements Q91 to Q94 in antiparallel.

In submodule 50 of FIG. 13, capacitor Ca is connected to output terminals 408x and 408y with different polarities, depending on the combination of how semiconductor switching elements Q91 to Q94 are turned on/off. Therefore, output voltage between output terminals 408x and 408y can be switched among +Vca, 0, and −Vca by using voltage Vca of capacitor Ca.

Referring to FIG. 12 again, in each arm circuit 430, output voltage between output terminals 408x and 408y of the plurality of submodules 50 is controlled by turning on and off the semiconductor switching elements. As a result, in the modular multilevel converter, the above-described AC/DC conversion or DC/AC conversion can be performed bidirectionally between DC voltage of DC nodes 407x and 407y and AC voltage (three-phase voltage) of AC nodes 406u, 406v, and 406w. In particular, in the modular multilevel converter, DC voltage between DC nodes 407x and 407y can be controlled as desired in response to a voltage command value.

Referring to FIG. 11 again, testing converter 400a has DC nodes 407x and 407y (see FIG. 12) electrically connected to primary side DC terminals 1a and 1b of power conversion device 100 via power cable PL1. Testing converter 400b has DC nodes 407x and 407y (see FIG. 12) electrically connected to secondary side DC terminals 2a and 2b of power conversion device 100 via power cable PL2.

AC power supply 301 is electrically connected to AC nodes 406u, 406v, and 406w (FIG. 12) of testing converter 400a by power cable PL10. Testing converter 400b has AC nodes 406u, 406v, and 406w electrically connected to AC power supply 301 via power cables PL11 and PL10. Note that testing converters 400a and 400b may each have AC nodes 406u, 406v, and 406w electrically connected to power cable PL10 or PL11 via a three-phase transformer (not shown).

Circuit breaker 305 and measuring instrument 306 are connected to power cable PL10. Circuit breaker 305 has a protective function to interrupt or form a current path in response to an open/close command received from control device 350 and automatically interrupt the current path when a value of a current exceeds a predetermined reference value. Measuring instrument 306 measures active power Ps supplied from AC power supply 301.

Measuring instrument 307 for measuring AC power input/output to/from testing converter 400a is connected to power cable PL10. Similarly, measuring instrument 308 for measuring AC power input/output to/from testing converter 400b is connected to power cable PL11. Measuring instruments 206 and 208 for measuring active power Pi are connected to power cable PL1, and measuring instruments 209 and 212 for measuring active power Po are connected to power cable PL2. A measurement value obtained by each measuring instrument is input to control device 350.

Furthermore, control device 350 can generate a command to open/close circuit breaker 305, a command value for power conversion device 100, and a command value for testing converters (or modular multilevel converters) 400a and 400b. Thereby, in testing power conversion device 100, opening/closing circuit breaker 305, an operation in power conversion device 100 (for example, turning on/off the semiconductor switching elements constituting converter cell 10), and output voltage of testing converters 400a, 400 can be controlled.

For example, control device 350 generates a command value for testing converter 400a that is connected to primary side DC terminals 1a and 1b so that DC voltage between DC nodes 7x and 7y of the modular multilevel converter is controlled to be DC voltage V1. Similarly, control device 350 generates a command value for testing converter 400b that is connected to secondary side DC terminals 2a and 2b so that DC voltage between DC nodes 7x and 7y of the modular multilevel converter is controlled to be DC voltage V2.

Further, similarly as done for control device 250 of the first embodiment, a value sensed in power conversion device 100, e.g., a value in temperature sensed of the semiconductor switching elements and the freewheeling diodes when a test is conducted, as has been described with reference to FIGS. 3 and 4, can be input to control device 350.

In power conversion device 100 which is a test target of test system 5c, primary side DC terminals 1a and 1b correspond to the "input side" and secondary side DC terminals 2a and 2b correspond to the "output side." Note that since DC voltages of power cables PL1 and PL2 can be controlled by testing converters 400a and 400b, the test target of test system 5c may be either a power conversion device with V1=V2 (the first power conversion device) or power conversion devices 100 with V1≠V2 (the second power converter).

When testing power conversion device 100 in test system 5c, by controlling active power of power conversion device 100 in response to a command value issued from control device 350, while active power Pi is input to primary side DC terminals 1a and 1b, active power Po is output from secondary side DC terminals 2a and 2b. Furthermore, in response to a command value issued from control device 350, testing converter 400a performs AC/DC conversion so as to control power cable PL1 at DC voltage V1, and testing converter 400b performs DC/AC conversion so as to control power cable PL2 at DC voltage V2.

As a result, active power Pf is generated on the AC side of testing converter 400a (or on power cable PL10), and active power Pb is generated on the AC side of testing converter 400b (or on power cable PL11).

Active power Pb on the AC side of testing converter 400b will be a part of active power Pf on the AC side of testing converter 400a. That is, active power Po output from secondary side DC terminals 2a and 2b of power conversion device 100 is transmitted by power cables PL2 and PL11 through power conversion by testing converters 400a and 400b to primary side DC terminals 1a and 1b of power conversion device 100 and becomes a part of active power Pi input to power conversion device 100.

Therefore, active power Ps supplied from AC power supply 301 will be Ps=Pf−Pb. Pf−Pi corresponds to loss in testing converter 400a, Po−Pf corresponds to loss in testing converter 400b, and Po–Pi corresponds to loss in power conversion device 100, and accordingly, it is understood that power Ps corresponds to total loss in testing converters 400a, 400b and power conversion device 100.

Thus, test system 5c according to the second embodiment can test power conversion device 100 by supplying active power Ps smaller than active power Po passing through power conversion device 100. This allows a testing power supply (AC power supply 301), circuit breaker 305, and measuring instrument 306 to have reduced rated capacities. As a result, test system 5c can be reduced in size and cost, and power conversion device 100 can be efficiently tested even when an AC power supply (including a power supply system) is used as a testing power supply.

Note that in the example configuration of FIG. 11, power cables PL10 and PL1 correspond to an embodiment of the "first connection member," and power cables PL11 and PL2 correspond to an embodiment of the "second connection member." Further, testing converter 400a corresponds to a "first testing converter," and testing converter 400b corresponds to a "second testing converter."

The test conducted at power conversion device 100 has specific contents which are similar to those in the first embodiment, including a heat run test and generation of reactive power, and accordingly, will not be described repeatedly in detail. Test system 5c according to the second embodiment also allows a heat run test to be conducted with reactive power Qc passed. In particular, by generating reactive power Qc in power conversion device 100, the rated power of testing converters 400a and 400b can be suppressed, so that not only AC power supply 301 but also testing converters 400a and 400b can be reduced in size.

Note that while an example has been described in which in test system 5c, while testing converters 400a and 400b control DC voltages V1 and V2, power conversion device 100 controls active powers Po and Pi, this manner of sharing control is changeable. For example, one of testing converters 400a and 400b can control one of DC voltages V1 and V2, and the other of DC voltages V1 and V2 can be controlled by power conversion device 100. In that case, the other of testing converters 400a and 400b controls active power (Pi or Pb) rather than DC voltage (V1 or V2). According to a test causing this operation, voltage controllability of power conversion device 100 can be evaluated.

Alternatively, in test system 5c, a behavior when DC-side voltage of power conversion device 100 rapidly decreases can be evaluated by rapidly decreasing DC voltage that testing converter 400a or 400b controls.

Modification of Second Embodiment

While test system 5c according to the second embodiment can test both power conversion device 100 with V1=V2 and power conversion device 100 with V1 V2, two testing converters 400a and 400b are disposed to control DC voltages V1 and V2, respectively. In a modification of the second embodiment, a simple configuration of a test system specialized for power conversion device 100 with V1=V2 will be described.

Figure 15:
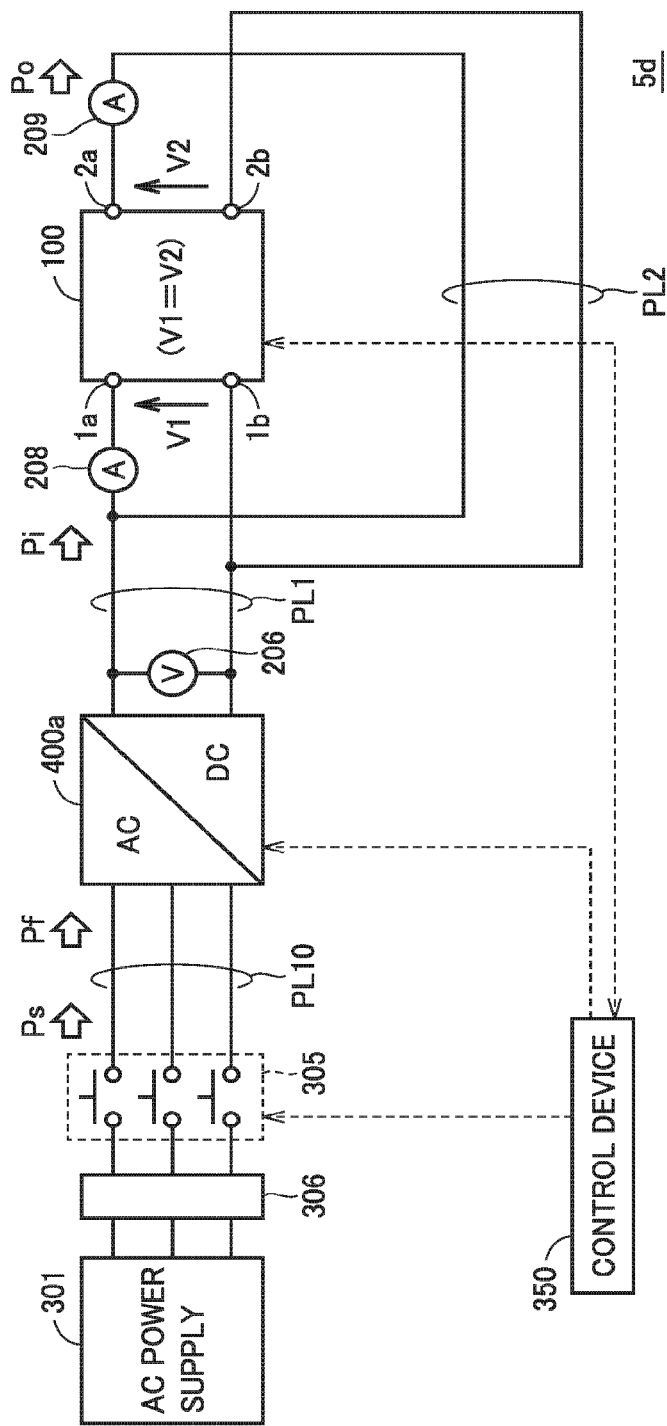
FIG. 15 is a block diagram for illustrating an example configuration of a system to test a power conversion device according to a modification of the second embodiment.

FIG. 15 is a block diagram for illustrating an example configuration of a test system 5d to test a power conversion device according to a modification of the second embodiment.

Referring to FIG. 15, test system 5d includes AC power supply 301, testing circuit breaker 305, measuring instruments 206, 208, 209, 306, testing converter 400a, power cables PL1, PL2, PL10, and control device 350. Further, in power conversion device 100 that is a test target, DC voltage V1 of primary side DC terminals 1a and 1b is equivalent to DC voltage V2 of secondary side DC terminals 2a and 2b.

When test system 5d is compared with test system 5c according to the second embodiment (see FIG. 11), test system 5d differs in that testing converter 400b and power cable PL11 are dispensed with. Furthermore, power cable PL2 is electrically connected between secondary side DC terminals 2a and 2b of power conversion device 100 and power cable PL1, as in the first embodiment and a modification thereof (see FIGS. 7 and 10). Test system 5d has a remainder in configuration similar to that of test system 5c according to the second embodiment, and accordingly, will not be described repeatedly in detail.

Power cable PL2 electrically connects secondary side DC terminals 2a and 2b of power conversion device 100 to AC power supply 301 via power cables PL1 and PL10 and testing converter 400a. That is, in the example configuration of FIG. 15, power cable PL1 corresponds to an embodiment of the "first connection member," and power cable PL2 corresponds to an embodiment of a "second connection member."

In test system 5d, active power Po output from secondary side DC terminals 2a and 2b of power conversion device 100 is transmitted to primary side DC terminals 1a and 1b of power conversion device 100 by power cable PL2 and becomes a part of active power Pi input to power conversion device 100.

Furthermore, active power Ps supplied from AC power supply 301 is equal to active power Pf on the AC side of testing converter 400a, and Pf–Pi corresponds to loss of testing converter 400a. As a result, it is understood that active power Ps corresponds to a total of loss in testing converter 400a and power conversion device 100.

Thus, test system 5d according to a modification of the second embodiment can test power conversion device 100 by supplying active power Ps smaller than active power Po passing through power conversion device 100. As a result, a testing power supply (AC power supply 301), circuit breaker 305, and measuring instrument 306 can have reduced rated capacities, and test system 5d can be reduced in size and cost.

Furthermore, when compared with test system 5c, a smaller number of testing converters can be disposed, so that in a configuration using an AC power supply (including a power supply system) as a testing power supply, a test system specialized for power conversion device 100 with V1=V2 can further be reduced in size.

In test system 5d as well, the test conducted at power conversion device 100 has specific contents which are similar to those in the first embodiment, including a heat run test and generation of reactive power, and accordingly, will not be described repeatedly in detail. Further, while in FIG. 15 power conversion device 100 with DC voltages V1 and V2 being equivalent (the first power conversion device) is indicated as a test target by way of example, in test system 5d two power conversion devices with DC voltages V1 and V2 being different (the second power conversion device) connected similarly as shown in FIG. 10 (a modification of the first embodiment) can also be a test target.

Third Embodiment

In a third embodiment will be described a test system and a test method according the first and second embodiments and their modifications with an inductance element added to a DC terminal of a test target, or a power conversion device.

Figure 16:
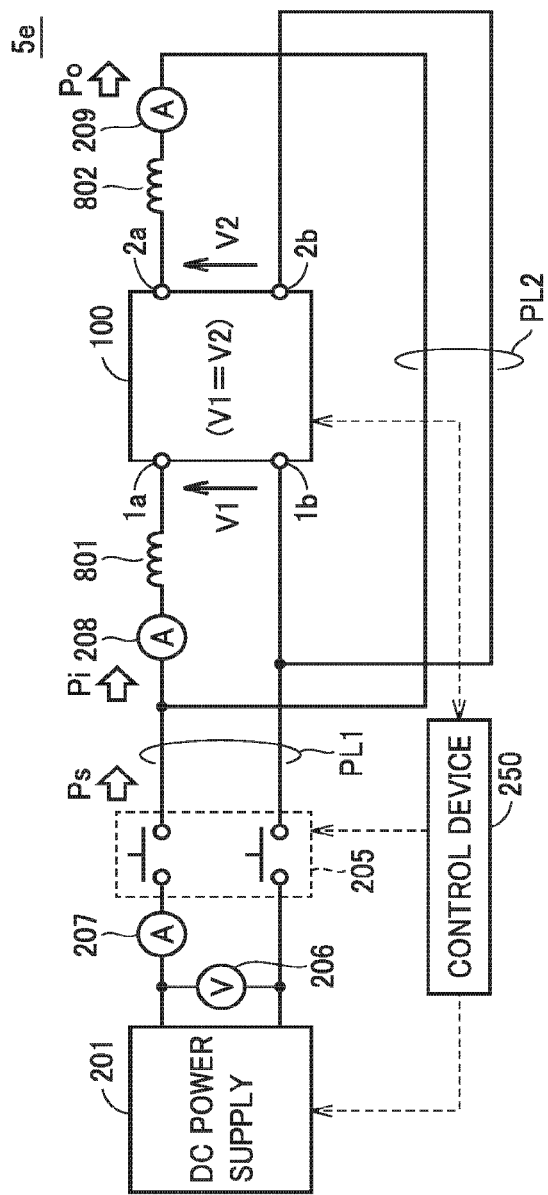
FIG. 16 is a block diagram for illustrating an example configuration of a system to test a power conversion device according to a third embodiment.

FIG. 16 is a block diagram for illustrating an example configuration of a test system to test a power conversion device according to the third embodiment.

Referring to FIG. 16, a test system 5e according to the third embodiment corresponds to test system 5c (see FIG. 7) according to the first embodiment plus an inductance element 801 added to primary side DC terminal 1a of power conversion device 100 and an inductance element 802 added to secondary side output terminal 2a thereof. Typically, inductance elements 801 and 802 can be added by connecting inductors. Alternatively, inductance elements 801 and 802 may be added by parasitic inductances of power cables PL1 and PL2 that are "connection members." For example, inductance elements 801 and 802 can be added by intentionally increasing power cables PL1 and PL2 in length.

When a ripple current is generated by a switching operation of power conversion device 100, the ripple current should flow to capacitors 6 and 7 (FIG. 2) present inside power conversion device 100, and therefore does not flow out of power conversion device 100. However, when an inductance component outer than the group of DC terminals (1a, 1b, 2a, 2b) of power conversion device 100 is small, the above capacitor's filtering effect is not sufficiently exhibited, and the ripple current may flow out of power conversion device 100 through the group of DC terminals (1a, 1b, 2a, 2b).

When the ripple current flows to the capacitor, power loss occurs in the capacitor, and the temperature of the capacitor rises. Since heat generation in the capacitor significantly affects the life of power conversion device 100, it is necessary to evaluate it by a test. If the ripple current flows out of power conversion device 100, as described above, during a test, what effect the ripple current has in the capacitor in power conversion device 100 cannot be correctly tested, and a correct lifetime evaluation for power conversion device 100 may no longer be performed.

In a test system according to the third embodiment, an inductance element is added to at least a part of the group of DC terminals (1a, 1b, 2a, 2b) of a test target or power conversion device 100. That is, in other words, power conversion device 100 (a test target) is tested by supplying power from DC power supply 201 while an inductance element is added to at least a part of the group of DC terminals (1a, 1b, 2a, 2b) of power conversion device 100.

Thus, power conversion device 100 can be tested in such a manner that the ripple current flows to the capacitor in power conversion device 100 rather than flowing out of power conversion device 100. As a result, accuracy of a test for evaluation of life for power conversion device 100 can be improved.

While in FIG. 16 inductance elements 801 and 802 are added to primary side DC terminal 1a and secondary side DC terminal 2a, inductance element 801 may be added on the primary side to primary side DC terminal 1b. Similarly, inductance element 802 may be added on the secondary side to secondary side DC terminal 2b. Alternatively, inductance element 801 or 802 can be added only to one of the primary side and the secondary side.

While in FIG. 16 an example configuration in which an inductance element is added to test system 5a (see FIG. 7) according to the first embodiment has been described, an inductance element can also be added to at least one of primary side DC terminal 1a, 1b and secondary side DC terminal 2a, 2b in the test systems according to a modification of the first embodiment (see FIG. 10), the second embodiment (see FIG. 11) and a modification of the second embodiment (see FIG. 15), similarly as has been described with reference to FIG. 16.

The first to third embodiments and their modifications present configurations of power conversion device 100 and testing converter 400 by way of example and any circuit configuration therefor is applicable insofar as similar DC/DC conversion or AC/DC conversion is possible.

While the first to third embodiments and their modifications present a power cable as an embodiment of a "connection member," a connection member other than the power cable is applicable insofar as it ensures electrical connection. That is, the "connection member" does not necessarily indicate an electric wire having a protective sheath on an insulated power supply; rather, it means a conductor that can pass a current. When a bare conductor (for example, a bus bar) having a conductor uninsulated is used as the "connection member," it is preferable to insulate it with an insulator or the like.

Lastly, the method for testing a power conversion device disclosed in the present embodiment will be summarized A method for testing a power conversion device, at least one power conversion device (100a-100d) being a test target in the method. The power conversion device performs DC voltage conversion between a primary side DC terminal (1a, 1b) and a secondary side DC terminal (2a, 2b) for inputting and outputting DC voltage. When the test target is tested, from a testing power supply (201, 301) electrically connected to an input side of the test target by a first connection member (PL1), the test target, with an output side of the test target and the input side electrically connected via a second connection member (PL2), is supplied via the first connection member with active power (Ps) smaller than active power passing through the test target (Pi).

In the method for testing a power conversion device, the test target may be a first power conversion device (100b, 100c) with the DC voltage being equivalent between the primary side DC terminal (1a, 1b) and the secondary side DC terminal (2a, 2b). When the test target is tested, the first power conversion device may receive power from the testing power supply (201) while the testing power supply and the primary side DC terminal are electrically connected by the first connection member (PL1) and the secondary side DC terminal and the first connection member are be electrically connected by the second connection member (PL2).

In the method for testing a power conversion device, the test target may include two second power conversion devices (100a, 100d) with the DC voltage being different between the primary side DC terminal (1a, 1b) and the secondary side DC terminal (2a, 2b), The two second power conversion devices have their respective secondary DC terminals electrically connected to each other. The first connection member (PL1) may electrically connect the primary side DC terminal of one of the two second power conversion devices and the testing power supply. When the test target is tested, the two second power conversion devices may receive power from the testing power supply (201) while the primary side DC terminal of the other of the two second power conversion devices and the first connection member are electrically connected by the second connection member (PL2).

In the method for testing a power conversion device, the DC voltage (V1) of the primary side DC terminal (1a, 1b) may be lower than the DC voltage (V2) of the secondary side DC terminal (2a, 2b), or the testing power supply may include a DC power supply (201).

In the method for testing a power conversion device, the testing power supply may include an AC power supply (301). When the test target is tested, AC/DC voltage conversion is performed between AC voltage of the AC power supply and DC voltage of the primary side DC terminal by a first testing converter (400a) electrically connected between the AC power supply and the primary side DC terminal (1a, 1b) via the first connection member (PL1). DC/AC voltage conversion is performed between DC voltage of the secondary side DC terminal (2a, 2b) and AC voltage of the AC power supply by a second testing converter (400b) electrically connected between the AC power supply and the secondary side DC terminal via the second connection member. The power conversion device may receive power from the testing power supply while the primary side DC terminal and the secondary side DC terminal are electrically connected via the first and second connection members (PL1, PL2).

In the method for testing a power conversion device, the test target may include a first power conversion device (100b, 100c) with the DC voltage equivalent between the primary side DC terminal (1a, 1b) and the secondary side DC terminal (2a, 2b) or two second power conversion devices (100a, 100d) with the DC voltage different between the primary side DC terminal and the secondary side DC terminal. The testing power supply may include an AC power supply (301). When the test target is tested, AC/DC voltage conversion is performed between AC voltage of the AC power supply and DC voltage of the primary side DC terminal by a testing converter (400a) electrically connected between the AC power supply and the primary side DC terminal via the first connection member (PL1). The first power conversion device may receive power from the testing power supply while the primary side DC terminal and the secondary side DC terminal are electrically connected via the first and second connection members (PL1, PL2).

In the method for testing a power conversion device, each testing converter (400a, 400b) may be a modular multilevel converter having a plurality of submodules (50). Furthermore, the power conversion device (100a-100d) may include a plurality of converter cells (10). Each of the plurality of converter cells may include: a primary side DC node (11a, 11b) electrically connected to the primary side DC terminal (1a, 1b); a secondary side DC node (12a, 12b) electrically connected to the secondary side DC terminal (2a, 2b); a transformer (8) having a primary side winding (8x) and a secondary side winding (8y); a first power conversion unit (41) connected between the primary side DC node and the primary side winding; a first capacitor (6) connected to the primary side DC node; a second power conversion unit (42) connected between the secondary side DC node and the secondary side winding; and a second capacitor (7) connected to the secondary side DC node. Each of the first and second power conversion units may perform power conversion between DC voltage and AC voltage by controlling turning on/off a plurality of semiconductor switching elements (Q11-Q14, Q21-Q24).

In the method for testing a power conversion device, in testing the test target, the plurality of semiconductor switching elements (Q11-Q14, Q21-Q24), may be controlled so that in each power conversion device, reactive power generated by AC voltage is larger than active power (Po) passing through the power conversion device (100a-100d). Furthermore, when the test target is tested the test target may receive power from the testing power supply via the first connection member (PL1) with an inductance element (801, 802) added to at least one of the primary side DC terminal (1a, 1b) and the secondary side DC terminal (2a, 2b) of each power conversion device (100a-100d).

The embodiments disclosed herein are also planned to be combined together as appropriate for implementation. It should be understood that the embodiments disclosed herein have been described for the purpose of illustration only and in a non-restrictive manner in any respect. The scope of the present invention is defined by the terms of the claims, rather than the embodiments description above, and is intended to include any modifications within the meaning and scope equivalent to the terms of the claims.

REFERENCE SIGNS LIST 1a, 1b primary side DC terminal, 2a, 2b secondary side DC terminal, 3, 8 transformer, 5a-5d test system, 6, 7, Ca capacitor, 8x primary side winding, 8y secondary side winding, 10 converter cell, 11a, 11b primary side DC node (power conversion device), 12a, 12b secondary side DC node (power conversion device), 30, 80 equivalent inductance, 31a-31c, 81a, 81b primary side AC node, 32a-32c, 82a, 82b, secondary side AC node, 41, 51, first switching circuit, 42, 52, second switching circuit, 45, 55 control circuit, 50 submodule, 100, 100a-100d, power conversion device, 201 DC power supply, 205, 305 circuit breaker, 206-212, 306-308 measuring instrument, 250, 350 control device, 301 AC power supply, 400, 400a, 400b testing converter, 406u, 406v, 406w, AC node (MMC), 407x, 407y DC node (MMC), 408x, 408y output terminal (MMC), 410, 420, 510, 520 equivalent voltage source, 430 arm circuit (MMC), 801, 802 inductance element, D11-D14, D21-D24, D61-D66, D71-D76, D91-D94 freewheeling diode, Nx, Ny node, Pb, Pc, Pf, Pi, Pm, Po, Ps active power, PL1-PL3, PL10, PL11 power cable, Q11-Q14, Q21-Q24, Q61-Q66, Q71-Q76, Q91-Q94, semiconductor switching element, Qc reactive power, S11-S14 S21-S24, S61-S66, S71-S76 control signal (semiconductor switching element).

The invention claimed is:

1. A system to test, comprising:
a power converter to serve as a test target, the power converter to perform direct current (DC) voltage conversion between a primary side DC terminal and a secondary side DC terminal for inputting and outputting DC voltage;
a testing power supply for the test target;
a first connection to electrically connect the testing power supply and an input side of the test target; and
a second connection to electrically connect an output side of the test target and the testing power supply for transmitting active power output from the output side of the test target to the input side of the test target.

2. The system according to claim 1, wherein:
the test target is a first power converter with the DC voltage being equivalent between the primary side DC terminal and the secondary side DC terminal,
the first connection electrically connects the testing power supply and the primary side DC terminal, and
the second connection electrically connects the secondary side DC terminal and the first connection.

3. The system according to claim 1, wherein:
the test target includes two second power converters with the DC voltage being different between the primary side DC terminal and the secondary side DC terminal,
the two second power converters have their respective secondary DC terminals electrically connected to each other, the first connection electrically connects the primary side DC terminal of one of the two second power converters and the testing power supply, and the second connection electrically connects the primary side DC terminal of the other of the two second power converters and the first connection.

4. The system according to claim 3, wherein the DC voltage of the primary side DC terminal is lower than the DC voltage of the secondary side DC terminal.

5. The system according to claim 1, wherein the testing power supply includes a DC power supply.

6. The system according to claim 1, wherein:
the testing power supply includes an alternating current (AC) power supply, and
the system further comprises:
a first testing converter electrically connected between the AC power supply and the primary side DC terminal via the first connection to perform AC/DC voltage conversion between a first AC node electrically connected to the AC power supply and a first DC node electrically connected to the primary side DC terminal; and
a second testing converter electrically connected between the AC power supply and the secondary side DC terminal via the second connection to perform DC/AC voltage conversion between a second DC node electrically connected to the secondary side DC terminal and a second AC node electrically connected to the AC power supply.

7. The system according to claim 6, wherein each testing converter is a modular multilevel converter having a plurality of submodules.

8. The system according to claim 6, wherein each testing converter is a modular multilevel converter having a plurality of submodules.

9. The system according to claim 1, wherein:
the test target includes a first power converter with the DC voltage equivalent between the primary side DC terminal and the secondary side DC terminal or two second power converters with the DC voltage different between the primary side DC terminal and the secondary side DC terminal, the testing power supply including an alternating current (AC) power supply,
the system further comprises a testing converter electrically connected between the AC power supply and the primary side DC terminal via the first connection to perform AC/DC voltage conversion between an AC node electrically connected to the AC power supply and a DC node electrically connected to the primary side DC terminal,
the first connection electrically connects the DC node and the primary side DC terminal, and
the second connection electrically connects the secondary side DC terminal and the first connection.

10. The system according to claim 1, wherein:
the power converter includes a plurality of converter cells, the plurality of converter cells each including:
a primary side DC node electrically connected to the primary side DC terminal,
a secondary side DC node electrically connected to the secondary side DC terminal,
a transformer having a primary side winding and a secondary side winding,
a first power converter connected between the primary side DC node and the primary side winding,
a first capacitor connected to the primary side DC node,
a second power converter connected between the secondary side DC node and the secondary side winding, and a second capacitor connected to the secondary side DC node, and the first and second power converters each perform power conversion between DC voltage and alternating current (AC) voltage by controlling turning on/off a plurality of semiconductor switching elements.

11. The system according to claim 10, wherein the plurality of semiconductor switching elements are controlled so that in each power converter, reactive power generated by AC voltage is larger than active power passing through the power converter.

12. The system according to claim 1, further comprising an inductance element added to at least one of the primary side DC terminal and the secondary side DC terminal of the power converter.

13. A method for testing a power converter which is a test target in the method, wherein:
the power converter device performs direct current (DC) voltage conversion between a primary side DC terminal and a secondary side DC terminal for inputting and outputting DC voltage, and
when the test target is tested, from a testing power supply electrically connected to an input side of the test target by a first connection, the test target, with an output side of the test target and the input side electrically connected via a second connection, is supplied via the first connection with active power smaller than active power passing through the test target.

14. A device to test a power converter to serve as a test target, the power converter to perform direct current (DC) voltage conversion between a primary side DC terminal and a secondary side DC terminal for inputting and outputting DC voltage, the testing device comprising:
a testing power supply for the test target;
a first connection to electrically connect the testing power supply and an input side of the test target; and
a second connection to electrically connect an output side of the test target and the testing power supply for transmitting active power output from the output side of the test target to the input side of the test target.

15. The device according to claim 14, wherein:
the test target is a first power conversion device with the DC voltage being equivalent between the primary side DC terminal and the secondary side DC terminal,
the first connection electrically connects the testing power supply and the primary side DC terminal, and
the second connection electrically connects the secondary side DC terminal and the first connection.

16. The device according to claim 14, wherein:
the test target includes two second power converters with the DC voltage being different between the primary side DC terminal and the secondary side DC terminal,
the two second power converters have their respective secondary DC terminals electrically connected to each other,
the first connection electrically connects the primary side DC terminal of one of the two second power converters and the testing power supply, and
the second connection electrically connects the primary side DC terminal of the other of the two second power converters and the first connection.

17. The device according to claim 16, wherein the DC voltage of the primary side DC terminal is lower than the DC voltage of the secondary side DC terminal.

18. The device according to claim 14, wherein the testing power supply includes a DC power supply.

19. The device according to claim 14, wherein:

the testing power supply includes an alternating current (AC) power supply, and the device further comprises:

a first testing converter electrically connected between the AC power supply and the primary side DC terminal via the first connection to perform AC/DC voltage conversion between a first AC node electrically connected to the AC power supply and a first DC node electrically connected to the primary side DC terminal; and a second testing converter electrically connected between the AC power supply and the secondary side DC terminal via the second connection to perform DC/AC voltage conversion between a second DC node electrically connected to the secondary side DC terminal and a second AC node electrically connected to the AC power supply.

20. The device according to claim 14, wherein:

the test target includes a first power converter with the DC voltage equivalent between the primary side DC terminal and the secondary side DC terminal or two second power converters with the DC voltage different between the primary side DC terminal and the secondary side DC terminal, the testing power supply including an alternating current (AC) power supply, the device further comprises a testing converter electrically connected between the AC power supply and the primary side DC terminal via the first connection to perform AC/DC voltage conversion between an AC node electrically connected to the AC power supply and a DC node electrically connected to the primary side DC terminal, the first connection electrically connects the DC node and the primary side DC terminal, and the second connection electrically connects the secondary side DC terminal and the first connection.

* * * * *